US008884470B2

(12) United States Patent
Nishijima

(10) Patent No.: US 8,884,470 B2
(45) Date of Patent: Nov. 11, 2014

(54) SEMICONDUCTOR DEVICE

(75) Inventor: Tatsuji Nishijima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 560 days.

(21) Appl. No.: 13/229,973

(22) Filed: Sep. 12, 2011

(65) Prior Publication Data

US 2012/0062430 A1    Mar. 15, 2012

(30) Foreign Application Priority Data

Sep. 13, 2010  (JP) ................. 2010-203878

(51) Int. Cl.
*H01F 27/42* (2006.01)
(52) U.S. Cl.
USPC ..................................... 307/104
(58) Field of Classification Search
USPC ..................................... 307/104
See application file for complete search history.

(56) References Cited

U.S. PATENT DOCUMENTS

| 3,529,248 | A | * | 9/1970 | Boelke .................. 327/46 |
|---|---|---|---|---|
| 5,731,856 | A | | 3/1998 | Kim et al. |
| 5,744,864 | A | | 4/1998 | Cillessen et al. |
| 6,294,274 | B1 | | 9/2001 | Kawazoe et al. |
| 6,427,065 | B1 | | 7/2002 | Suga et al. |
| 6,563,174 | B2 | | 5/2003 | Kawasaki et al. |
| 6,727,522 | B1 | | 4/2004 | Kawasaki et al. |
| 7,049,190 | B2 | | 5/2006 | Takeda et al. |
| 7,061,014 | B2 | | 6/2006 | Hosono et al. |
| 7,064,346 | B2 | | 6/2006 | Kawasaki et al. |
| 7,105,868 | B2 | | 9/2006 | Nause et al. |
| 7,211,825 | B2 | | 5/2007 | Shih et al |
| 7,282,782 | B2 | | 10/2007 | Hoffman et al. |
| 7,297,977 | B2 | | 11/2007 | Hoffman et al. |
| 7,323,356 | B2 | | 1/2008 | Hosono et al. |
| 7,385,224 | B2 | | 6/2008 | Ishii et al. |
| 7,402,506 | B2 | | 7/2008 | Levy et al. |
| 7,411,209 | B2 | | 8/2008 | Endo et al. |
| 7,453,065 | B2 | | 11/2008 | Saito et al. |

(Continued)

FOREIGN PATENT DOCUMENTS

| EP | 1737044 | A | 12/2006 |
|---|---|---|---|
| EP | 2226847 | A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Robert L. Deberadinis
(74) *Attorney, Agent, or Firm* — Husch Blackwell LLP

(57) ABSTRACT

An object is to provide a semiconductor device capable of preventing an alternating leakage current from flowing into a voltage detection circuit. The semiconductor device includes an antenna circuit, a resonance frequency regulating circuit, a voltage detection circuit, and a first capacitor. The resonance frequency regulating circuit includes a second capacitor including one terminal electrically connected to a first terminal of the antenna circuit; and a transistor including a first terminal electrically connected to the other terminal of the second capacitor, a second terminal electrically connected to a second terminal of the antenna circuit, and a gate electrically connected to the first capacitor and the voltage detection circuit.

26 Claims, 12 Drawing Sheets

(56) References Cited

U.S. PATENT DOCUMENTS

| | | | |
|---|---|---|---|
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,907,902 B2 * | 3/2011 | Kato et al. | 455/41.2 |
| 8,181,875 B2 | 5/2012 | Nishido | |
| 8,181,882 B2 | 5/2012 | Hata et al. | |
| 8,224,277 B2 | 7/2012 | Furutani | |
| 8,358,202 B2 | 1/2013 | Takahashi | |
| 8,439,270 B2 | 5/2013 | Nishijima | |
| 8,482,261 B2 | 7/2013 | Kato et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0150475 A1 | 6/2008 | Kato et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0163613 A1 | 7/2011 | Kato et al. | |
| 2011/0187435 A1 | 8/2011 | Kamata | |
| 2011/0235295 A1 | 9/2011 | Nishijima | |
| 2013/0240877 A1 | 9/2013 | Nishijima | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-53491 | 2/1999 |
| JP | 11-505377 | 5/1999 |
| JP | 2000-044236 A | 2/2000 |
| JP | 2000-150900 A | 5/2000 |
| JP | 2001-260580 | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1: Polarizer-Free Reflective LCD Combined With Ultra Low-Power Driving Techonology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions of Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E at al., "Wide-Bandgap High-Mobility Zno Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

(56) References Cited

OTHER PUBLICATIONS

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronics Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employng MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the INO3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO), (m = 7, 8, 9, and 16) in the In2O3—ZnGa2O4—ZnO System", Journal of Solid State Chemstry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMCLD Panel Using IgZo Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-Crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, NO. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

(56) References Cited

OTHER PUBLICATIONS

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803. Eng.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

2101

2102

2103

SEMICONDUCTOR DEVICE

BACKGROUND OF THE INVENTION

1. Field of the Invention

The field of the invention relates to a semiconductor device that wirelessly transmits and receives data.

2. Description of the Related Art

In recent years, semiconductor devices that wirelessly transmit and receive data are being developed. Examples of such a semiconductor device include those called an RFID (radio frequency identification) tag, an RF chip, an RF tag, an IC chip, an IC tag, a wireless chip, a wireless tag, an electronic chip, an electronic tag, a wireless processor, and a wireless memory.

For example, Patent Document 1 discloses an IC chip capable of reading and writing data by noncontact communication. Moreover, Patent Document 1 discloses that the IC chip wirelessly transmits and receives data to/from a reader/writer (hereinafter called an R/W) or the like.

Such a semiconductor device has the advantages of, for example, being small, lightweight, easy to use, and inexpensive and having a high level of security, and thus is used, for example, as a semiconductor device for managing goods. As described above, the applications of a semiconductor device that wirelessly transmits and receives data in various fields are being proposed.

REFERENCE

Patent Document

[Patent Document 1] Japanese Published Patent Application No. 2001-260580

SUMMARY OF THE INVENTION

A semiconductor device that wirelessly transmits and receives data transmits and receives a signal (a carrier wave or an amplitude modulation wave generated by superimposition of a modulated wave on a carrier wave) to/from a device capable of wirelessly transmitting and receiving data, such as an R/W, via an antenna circuit.

The semiconductor device derives a modulated wave by rectifying an amplitude modulation wave and demodulates the modulated wave, thereby recognizing data transmitted by the R/W or the like. Some of such semiconductor devices utilize DC voltage obtained by rectifying a carrier wave or an amplitude modulation wave as drive voltage for the semiconductor devices.

With a carrier wave or an amplitude modulation wave having a high electric power, voltage obtained in the semiconductor device by rectifying the carrier wave or the amplitude modulation wave becomes excessive, which may break the semiconductor device.

In the above-described semiconductor device, the electric power of a received carrier wave or amplitude modulation wave can be reduced by changing the resonance frequency of the antenna circuit in accordance with the voltage obtained by rectifying the carrier wave or the amplitude modulation wave. This is realized by a voltage detection circuit which judges whether voltage obtained by the rectification is excessive, and a resonance frequency regulating circuit which changes the resonance frequency of the antenna circuit in accordance with the output of the voltage detection circuit.

However, a leakage current which is an alternating current (hereinafter called an alternating leakage current) due to a signal from the antenna circuit flows into another circuit included in the semiconductor device (e.g., the voltage detection circuit) through the resonance frequency regulating circuit, thereby impairing the functions of the circuit (e.g., causing the circuit to malfunction) in some cases.

An object of one embodiment of the present invention is to provide a semiconductor device capable of preventing an alternating leakage current from flowing into the voltage detection circuit.

One embodiment of the present invention is a semiconductor device including: an antenna circuit; a voltage detection circuit; a first capacitor; and a resonance frequency regulating circuit. The resonance frequency regulating circuit includes: a second capacitor including a first terminal electrically connected to a first terminal of the antenna circuit; and a transistor including a first terminal electrically connected to a second terminal of the second capacitor, a second terminal electrically connected to a second terminal of the antenna circuit, and a gate electrically connected to the first capacitor and the voltage detection circuit.

One embodiment of the present invention is a semiconductor device including: an antenna circuit; a voltage detection circuit; a first capacitor; a resistor including a first terminal electrically connected to the voltage detection circuit; and a resonance frequency regulating circuit. The resonance frequency regulating circuit includes: a second capacitor including a first terminal electrically connected to a first terminal of the antenna circuit; and a transistor including a first terminal electrically connected to a second terminal of the second capacitor, a second terminal electrically connected to a second terminal of the antenna circuit, and a gate electrically connected to the first capacitor and a second terminal of the resistor.

The transistor may have an oxide semiconductor layer as a semiconductor layer.

Resonance frequency of the antenna circuit may be varied by the voltage detection circuit.

One embodiment of the present invention is a semiconductor device including: an antenna circuit; a frequency-regulating circuit configured to vary resonance frequency of the antenna circuit; a voltage detection circuit configured to control the resonance frequency regulating circuit; and a capacitor electrically connected to the resonance frequency regulating circuit and the voltage detection circuit.

One embodiment of the present invention is a semiconductor device including: an antenna circuit; a frequency-regulating circuit configured to vary resonance frequency of the antenna circuit; a voltage detection circuit configured to control the resonance frequency regulating circuit; a capacitor including a terminal electrically connected to the resonance frequency regulating circuit; and a resistor including a first terminal electrically connected to the voltage detection circuit, and a second terminal electrically connected to the terminal of the capacitor and the resonance frequency regulating circuit.

Electric power of a carrier wave or an amplitude modulation wave received by the antenna circuit may be reduced by varying the resonance frequency of the antenna circuit.

The voltage detection circuit may monitor a drive voltage generated on the basis of a signal received by the antenna circuit, and control the resonance frequency regulating circuit when the drive voltage reaches a predetermined value, thereby varying the resonance frequency of the antenna circuit.

One embodiment of the present invention can provide a semiconductor device capable of preventing an alternating leakage current from flowing into the voltage detection circuit.

DETAILED DESCRIPTION OF THE INVENTION

Figure 1:
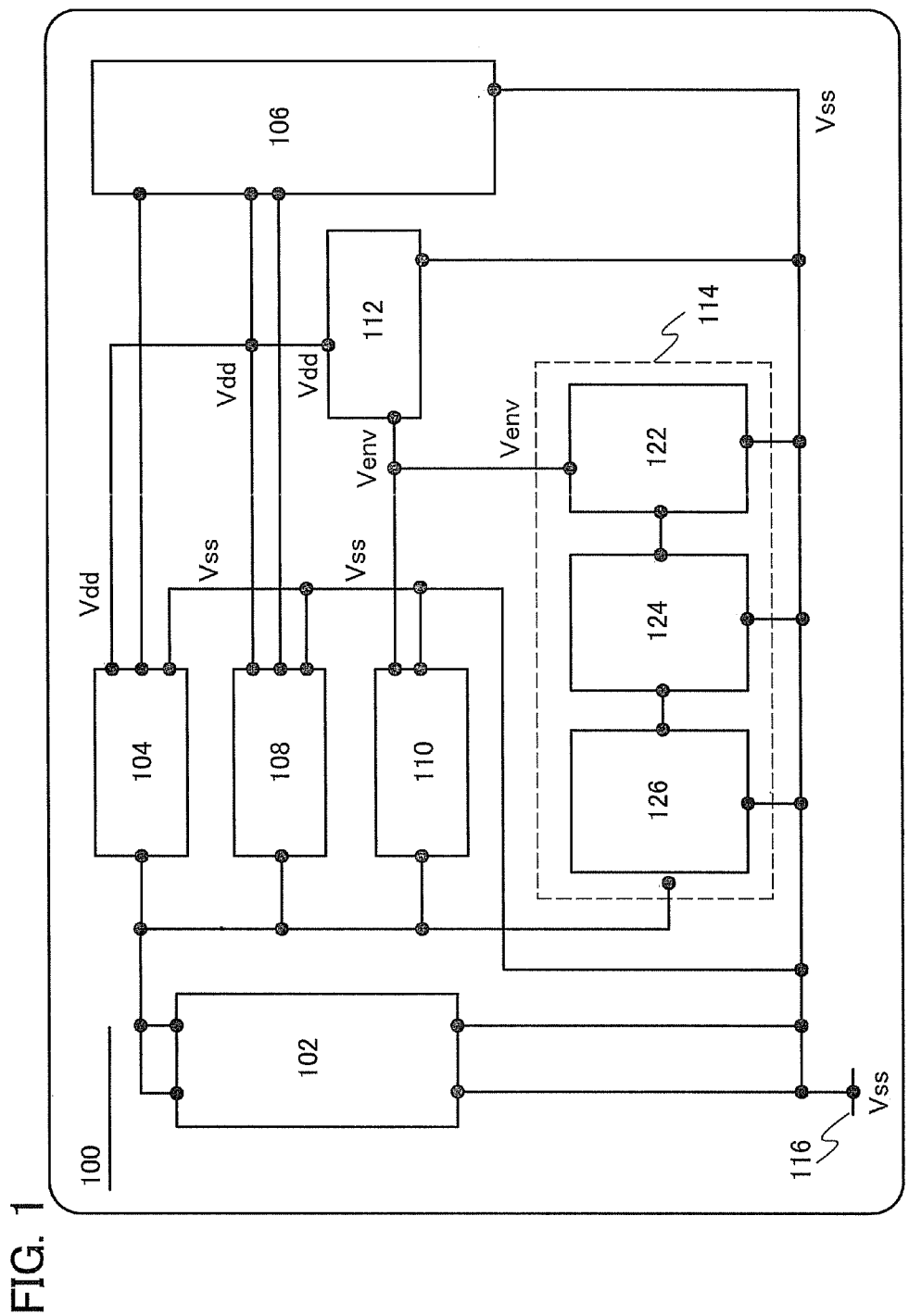
FIG. 1 is a diagram illustrating an example of a semiconductor device.

Examples of embodiments of the present invention will be described below with reference to the drawings. Note that the present invention is not limited to the following description. It will be readily appreciated by those skilled in the art that modes and details of the present invention can be modified in various ways without departing from the spirit and scope of the present invention. Therefore, the present invention should not be construed as being limited to the following description of the embodiments.

Note that the reference numeral indicating the same part is sometimes used in the different drawings in some cases. Further, in some cases, the same hatching patterns are applied to similar parts in the different drawings, and the similar parts are not necessarily designated by reference numerals.

Note that the contents of the embodiments can be combined with or replaced by one another as appropriate.

Note that, in this specification, the term "the k-th" (k is a natural number)" is used only for preventing confusion between components, and thus do not limit numbers.

Note that a difference between the potentials of two points (also referred to as a potential difference) is generally referred to as a voltage. However, in an electric circuit, a difference between the potential of one point and the potential serving as a reference (also referred to as a reference potential) may be used. Further, both voltage and potential may be expressed in the unit volt (V). Thus, in this specification, a potential difference between the potential of one point and the reference potential may be used as the voltage of that point unless otherwise specified.

Note that in this specification, the phrase "A and B are connected to each other" indicates the case where A and B are directly connected to each other, the case where A and B are electrically connected to each other, or the like. Specifically, the phrase "A and B are connected to each other" indicates the case where A and B can be regarded as having the same node in the description of the circuit operation, e.g., the case where A and B are connected to each other through an switching element such as a transistor and A and B have approximately the same potential when the switching element is conducting; or the case where A and B are connected to each other through a resistor and a potential difference across the resistor has such a magnitude that it has no influence on the operation of a circuit including A and B.

Embodiment 1

In this embodiment, an example of a semiconductor device that wirelessly transmits and receives data will be described with reference to FIG. 1 and FIG. 2.

FIG. 1 illustrates a wireless tag 100 as an example of the semiconductor device. The wireless tag 100 includes an antenna circuit 102, a demodulation circuit 104, a logic circuit 106, a modulation circuit 108, a rectifier circuit 110, a constant-voltage circuit 112, and a limiter circuit 114.

The antenna circuit 102 transmits and receives a signal (a carrier wave or an amplitude modulation wave) to/from an external device that is outside the wireless tag 100 and is capable of wirelessly transmitting and receiving data, such as an R/W.

The demodulation circuit 104 demodulates a signal received by the antenna circuit 102 and derives data from the signal. The derived data is input to the logic circuit 106.

The logic circuit 106 generates a signal, such as a response signal, in accordance with the data input from the demodulation circuit 104.

The modulation circuit 108 modulates the response signal input from the logic circuit 106 and generates a signal to be sent to the external device.

The rectifier circuit 110 rectifies the signal received by the antenna circuit 102 and generates an envelope voltage Venv which is a direct-current voltage.

The constant-voltage circuit 112 adjusts the magnitude of the envelope voltage Venv supplied by the rectifier circuit 110. Specifically, the constant-voltage circuit 112 adjusts the envelope voltage Venv so that its value becomes constant, and generates high supply voltage Vdd. Then, high supply voltage Vdd is supplied as drive voltage by the constant-voltage circuit 112 to the circuits such as the demodulation circuit 104, the logic circuit 106, and the modulation circuit 108.

Note that the constant-voltage circuit 112 is not necessarily provided. When the constant-voltage circuit 112 is not provided, the envelope voltage Venv is supplied as drive voltage from the rectifier circuit 110 to the circuits such as the demodulation circuit 104, the logic circuit 106, and the modulation circuit 108.

The limiter circuit 114 includes a voltage detection circuit 122, a filter circuit 124, and a resonance frequency regulating circuit 126.

The voltage detection circuit 122 monitors the envelope voltage Venv generated by the rectifier circuit 110 and supplies an output potential to the resonance frequency regulating circuit 126 in accordance with the value of the envelope voltage Venv.

The filter circuit 124 can prevent an alternating leakage current that occurs in the resonance frequency regulating circuit 126 from flowing into the voltage detection circuit 122.

The resonance frequency regulating circuit 126 varies the resonance frequency of the antenna circuit 102 in accordance with the output potential supplied by the voltage detection circuit 122.

Moreover, low supply voltage Vss is supplied from wiring 116 to each the circuits such as the antenna circuit 102, the demodulation circuit 104, the logic circuit 106, the modulation circuit 108, the rectifier circuit 110, the constant-voltage circuit 112, and the limiter circuit 114. Note that, for the low supply voltage Vss, the equations Vss<Vdd and Vss<Venv are satisfied.

Next, an example of the circuit configuration of the semiconductor device will be described with reference to FIG. 2.

Figure 2:
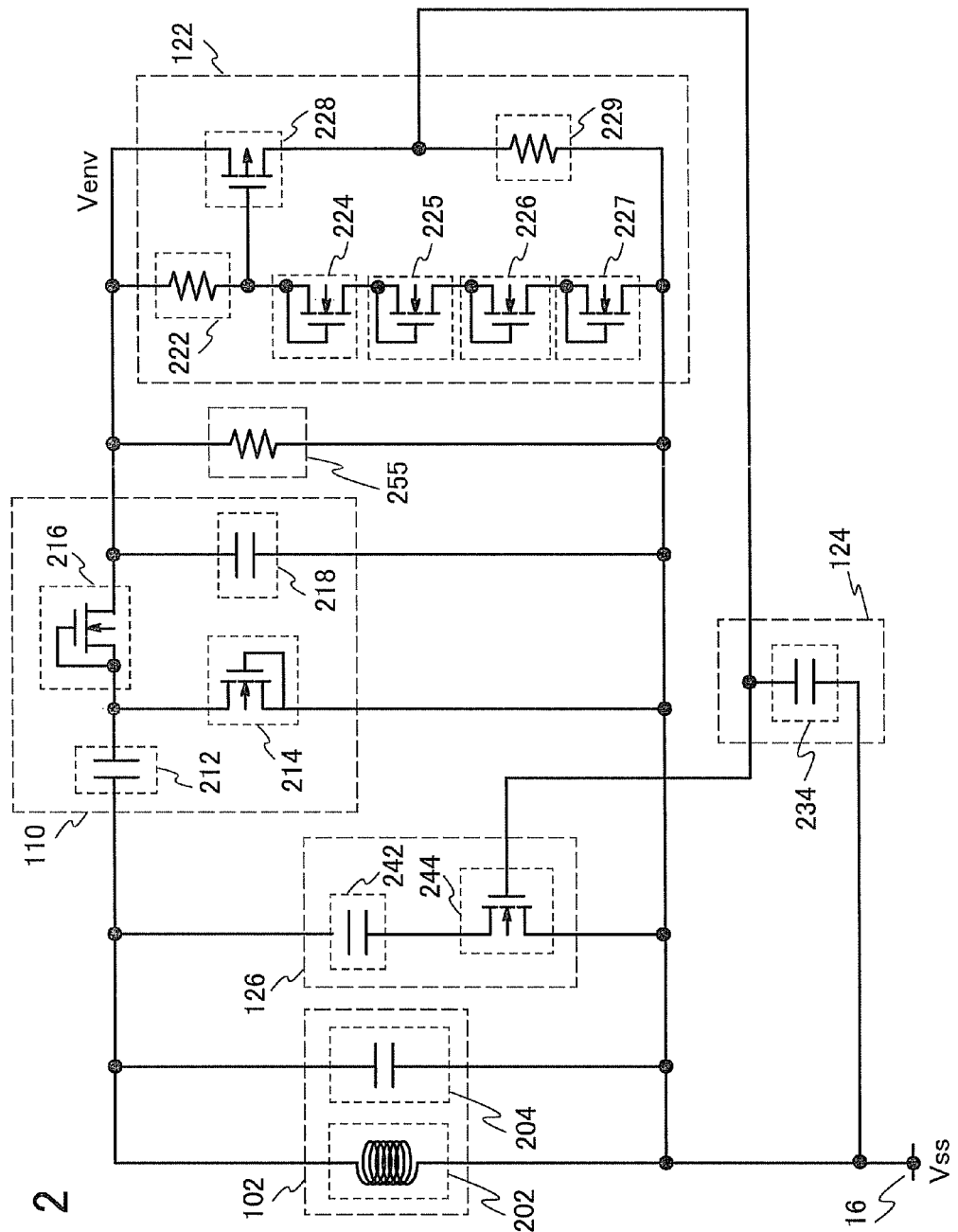
FIG. 2 is a diagram illustrating an example of the circuit configuration of a semiconductor device.

FIG. 2 illustrates the circuit configurations of the antenna circuit 102, the rectifier circuit 110, the voltage detection circuit 122, the filter circuit 124, the resonance frequency regulating circuit 126, and the like included in the semiconductor device.

In FIG. 2, the antenna circuit 102 includes an antenna 202 and a resonance capacitor 204 which form an LC parallel resonant circuit.

The capability of the antenna 202 to receive a signal from the external device varies depending on the shape or number of turns of the antenna 202, the transmission method which comes in the electromagnetic induction method, the radio wave method, and the like, the frequency band of the signal (a carrier wave or an amplitude modulation wave). Here, there is no particular limitation on them. The resonance capacitor 204 is provided to optimize the resonance frequency of the antenna circuit 102 so that it becomes around the frequency of the signal from the external device, in combination with the antenna 202.

The rectifier circuit 110 includes a half-wave voltage doubler rectifier circuit including a capacitor 212, a transistor 214, a transistor 216, and a capacitor 218. Note that the rectifier circuit 110 is not limited to the half-wave voltage doubler rectifier circuit, and may be a half-wave rectifier circuit, a full-wave rectifier circuit, a full-wave voltage doubler rectifier circuit, a bridge rectifier circuit, or the like.

A resistor 255 is a pull-down resistor and pulls down the output of the rectifier circuit 110 to the low supply voltage Vss when the generation of the envelope voltage Venv in the rectifier circuit 110 is not performed.

The voltage detection circuit 122 includes a resistor 222, a plurality of transistors connected in series, a transistor 228, and a resistor 229. The plurality of transistors is diode-connected transistors. Note that although transistors 224 to 227 are shown as the plurality of transistors in FIG. 2, the number of transistors is not limited to this.

The envelope voltage Venv is supplied by the rectifier circuit 110 to one terminal of the resistor 222 and a first terminal of the transistor 228. A first terminal of the transistor located at one end among the transistors 224 to 227 connected in series (here, the transistor 224) is connected to a gate of the transistor 228 and the other terminal of the resistor 222. A first terminal of the transistor located at the other end among the transistors 224 to 227 connected in series (here, the transistor 227) and one terminal of the resistor 229 are supplied with the low supply voltage Vss by the wiring 116. A second terminal of the transistor 228 and the other terminal of the resistor 229 are connected to the filter circuit 124.

The filter circuit 124 includes a capacitor 234. One terminal of the capacitor 234 is connected to the voltage detection circuit 122 and the resonance frequency regulating circuit 126. The other terminal of the capacitor 234 is connected to the wiring 116.

Note that although the low supply voltage Vss is supplied from the wiring 116 to the other terminal of the capacitor 234 in FIG. 2, this embodiment is not limited to this. Another wiring that supplies a potential to the other terminal of the capacitor 234 may be provided separately from the wiring 116.

The resonance frequency regulating circuit 126 includes a capacitor 242 and a transistor 244. One terminal of the capacitor 242 is connected to a first terminal of the antenna circuit 102, and the other terminal is connected to a first terminal of the transistor 244. A gate of the transistor 244 is connected to the filter circuit 124. Further, a second terminal of the transistor 244 is connected to a second terminal of the antenna circuit 102 and is supplied with the low supply voltage Vss by the wiring 116.

The voltage detection circuit 122 can monitor the envelope voltage Venv generated by the rectifier circuit 110 and supply an output potential to the resonance frequency regulating circuit 126 in accordance with the magnitude of the envelope voltage Venv. Specific operation will be described below.

When the envelope voltage Venv is low, the gate-source voltages are below the threshold voltages in the transistors 224 to 227, so that these transistors are off. Consequently, the potential of the gate of the transistor 228 becomes approximately equal to the envelope voltage Venv, so that the transistor 228 is turned off.

When the envelope voltage Venv increases, the gate-source voltages exceed the threshold voltages in the transistors 224 to 227, so that these transistors are turned on. At the same time, the potential of the gate of the transistor 228 becomes one obtained by voltage division between the transistors 224 to 227 which are on and the resistor 222, and is varied in accordance with variations in impedance between the source and the drain of each of the transistors 224 to 227.

When the envelope voltage Venv further increases and reaches a predetermined value, the gate-source voltage exceeds the threshold voltage in the transistor 228, so that the transistor 228 is turned on. Then, a potential obtained by voltage division between the transistor 228 which is on and the resistor 229 is supplied to the resonance frequency regulating circuit 126 as an output potential.

The resonance frequency regulating circuit 126 can vary the resonance frequency of the antenna circuit 102 when supplied with the output potential by the voltage detection circuit 122. Specific operation will be described below.

When the envelope voltage Venv reaches a predetermined value, the voltage detection circuit 122 supplies an output potential to the gate of the transistor 244. Subsequently, when the gate-source voltage exceeds the threshold voltage in the transistor 244, the transistor 244 is turned on.

The other terminal of the capacitor 242 is connected to the wiring 116 via the transistor 244 which is on. Consequently, the capacity of the capacitor 242 is effectively added to the resonance capacity, so that the resonance frequency varies, thereby reducing the electric power of a carrier wave or an amplitude modulation wave that the antenna 202 can receive.

As described above, by varying the resonance frequency of the antenna 202, the electric power of a carrier wave or an amplitude modulation wave received by the antenna circuit 102 can be reduced. Thus, the rectifier circuit 110 can be prevented from being damaged by the supply of a carrier wave or an amplitude modulation wave with high electric power.

Since the electric power of a carrier wave or an amplitude modulation wave received by the antenna circuit 102 can be reduced, the envelope voltage Venv generated in accordance with a signal received by the antenna circuit 102 can be lowered. Consequently, the constant-voltage circuit 112 can be prevented from being damaged by the supply of excessive envelope voltage Venv.

Similarly, when the high supply voltage Vdd generated from the envelope voltage Venv is used as drive voltage (or the envelope voltage Venv is used as drive voltage) in each of the circuits such as the demodulation circuit 104, the logic circuit 106, and the modulation circuit 108, each of the circuits can be prevented from being damaged by the supply of excessive drive voltage.

As described above, in the semiconductor device in this embodiment, by providing the resonance frequency regulating circuit 126, the resonance frequency of the antenna circuit 102 can be varied with the resonance frequency regulating circuit 126 in accordance with the output potential of the voltage detection circuit 122. Consequently, the electric power of a carrier wave or an amplitude modulation wave received by the semiconductor device can be reduced, thereby preventing circuits included in the semiconductor device from being damaged.

Here, an example of a semiconductor device that wirelessly transmits and receives data is a passive-type semiconductor device.

A passive-type semiconductor device generates a DC voltage from a signal (a carrier wave or an amplitude modulation wave) received by the antenna circuit 102 and uses it as electric power for driving the semiconductor device. Such a semiconductor device does not have a battery and thus has advantages of small size and light weight.

Here, since the passive-type semiconductor device gets electrical power to operate from a signal received by the antenna circuit 102, the amplitude of AC voltage in the antenna 202 is approximately equal to that of the generated DC voltage.

Therefore, providing the passive-type semiconductor device with the resonance frequency regulating circuit 126 and, as described above, reducing the electric power of a carrier wave or an amplitude modulation wave is particularly effective in preventing circuits included in the passive-type semiconductor device from being damaged.

Further, an alternating leakage current occurs in the resonance frequency regulating circuit 126.

The alternating leakage current is caused by the fact that the voltage amplitude of a signal from the antenna circuit 102 travels to the gate of the transistor 244 through parasitic capacitance formed between the gate and the drain of the transistor 244 or parasitic capacitance formed between the gate and the source of the transistor 244. Note that the alternating leakage current constantly leaks from the gate of the transistor 244 regardless of the on/off state of the transistor 244.

Moreover, the amplitude of AC voltage output from the antenna circuit 102 is approximately equal to that of the generated DC voltage, so that alternating leakage current has a magnitude which is not negligible in the circuit operation.

If such alternating leakage current flows into the voltage detection circuit, the voltage detection circuit malfunctions, so that the resonance frequency regulating circuit is controlled abnormally. Consequently, the resonance frequency of the antenna circuit is varied improperly. As a result, even in the case where the electric power of a carrier wave or an amplitude modulation wave received by the antenna circuit is not so high, the operation of the resonance frequency regulating circuit reduces the electric power received by the antenna circuit, thereby preventing the generation of voltage needed to drive the logic circuit and the like.

Further, the transistor and the resistor included in the voltage detection circuit consume the electric power of the alternating leakage current flowing thereinto. This consumption of the electric power greatly increases the power consumption of the whole semiconductor device.

On the other hand, the wireless tag 100 illustrated in FIG. 2 includes the filter circuit 124 including the capacitor 234.

In general, when a plurality of paths is present, current tends to flow to a path with lower impedance. In addition, a capacitor has impedance that decreases with increasing frequency.

Then, in the semiconductor device in this embodiment, providing the capacitor 234 can set the impedance between one terminal of the capacitor 234 and the wiring 116 (which corresponds to the AC impedance of the capacitor 234) lower than the impedance between one terminal of the capacitor 234 and the voltage detection circuit 122.

Therefore, an alternating leakage current that occurs in the resonance frequency regulating circuit 126 can be made to flow into the capacitor 234 more easily than into the voltage detection circuit 122, and thus passed (released) to the wiring 116 via the capacitor 234.

As described above, by passing an alternating leakage current that occurs in the resonance frequency regulating circuit 126 preferentially to the capacitor 234 included in the filter circuit 124, the alternating leakage current can be prevented from flowing into the voltage detection circuit 122.

As described above, in the semiconductor device in this embodiment, an alternating leakage current that occurs in the resonance frequency regulating circuit 126 is passed preferentially to the capacitor 234 included in the filter circuit 124. This can prevent the alternating leakage current from flowing into the voltage detection circuit 122, prevent malfunction of the voltage detection circuit 122, and suppress the power consumption of the whole semiconductor device.

Consequently, the resonance frequency regulating circuit 126 can be controlled normally by the output potential of the voltage detection circuit 122. Thus, the resonance frequency of the antenna circuit 102 can be varied properly.

In contrast, according to calculation, a capacitor in an AC circuit consumes power instantly, but average power per cycle is zero. This is because that a reactive element such as a capacitor stores electric energy and discharges the stored electric energy. Therefore, in an AC circuit, a reactive element such as a capacitor consumes no power. In other words, a reactive element included in a circuit in a semiconductor device or the like can be regarded as an element which consumes no electric power regardless of the operation or the like of the circuit.

For this reason, the use of the capacitor 234 which is a reactive element reduces the consumption of electric power independent of the operation or the like of the semiconductor device, allowing electric power consumed as leakage current to be used as drive electric power which is used for communication. Consequently, the maximum communication range or the number of concurrently recognized devices can be increased.

Embodiment 2

In this embodiment, an example of the circuit configuration of the semiconductor device in Embodiment 1 illustrated in FIG. 1, which is different from that in FIG. 2, will be described with reference to FIG. 3.

Figure 3:
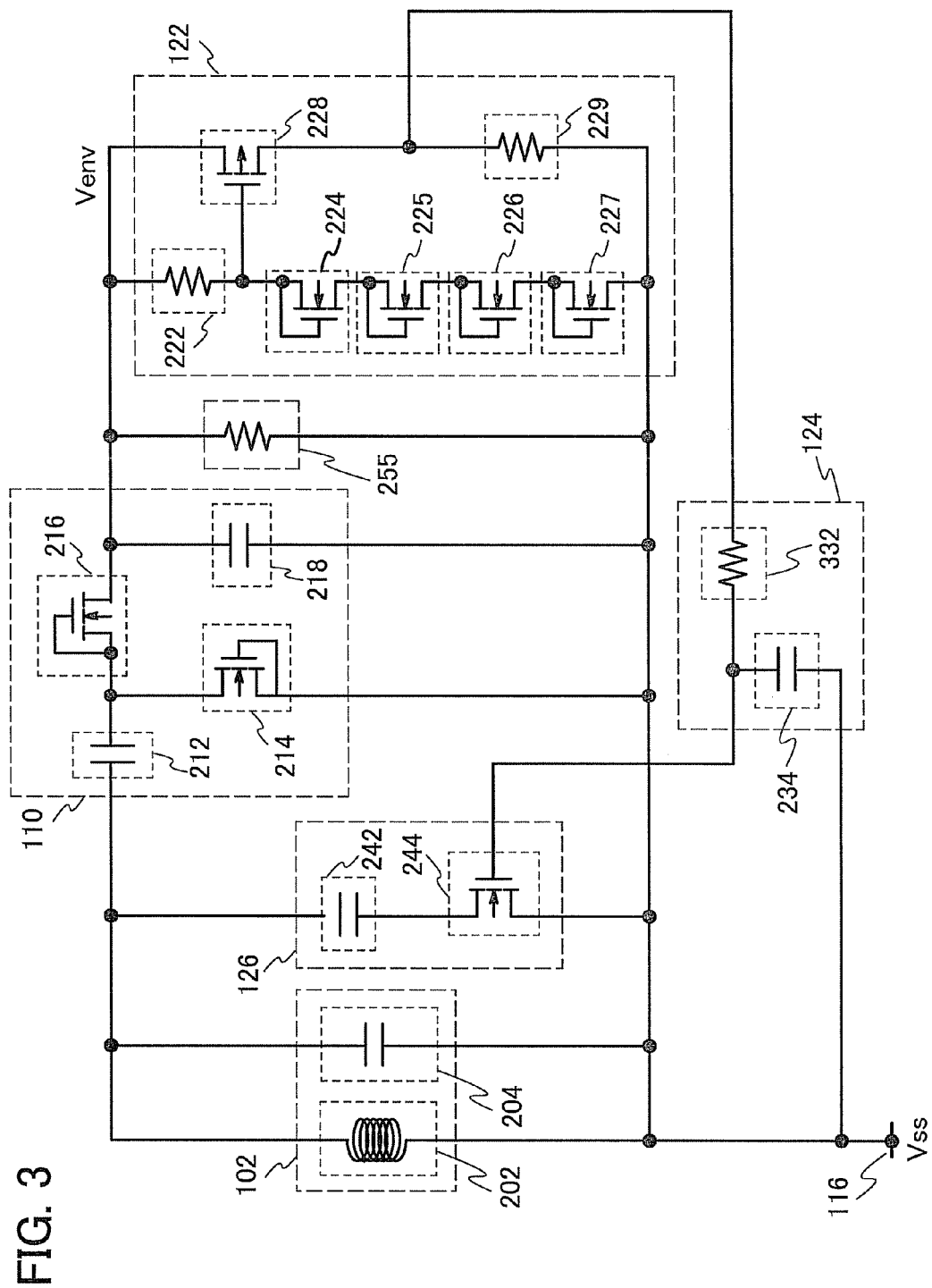
FIG. 3 is a diagram illustrating an example of the circuit configuration of a semiconductor device.

In FIG. 3, the filter circuit 124 includes the capacitor 234 and a resistor 332. The resistor 332 is provided between one terminal of the capacitor 234 and the voltage detection circuit 122.

Specifically, one terminal of the capacitor 234 is connected to the gate of the transistor 244 and one terminal of the resistor 332, and the other terminal is connected to the wiring 116. Further, the other terminal of the resistor 332 is connected to the voltage detection circuit 122.

Note that although the wiring 116 supplies the low supply voltage Vss to the other terminal of the capacitor 234 in FIG. 3, this embodiment is not limited to this. Another wiring that supplies a potential to the other terminal of the capacitor 234 may be provided separately from the wiring 116.

The configurations of the antenna circuit 102, the rectifier circuit 110, the voltage detection circuit 122, and the resonance frequency regulating circuit 126 are similar to those in FIG. 2, so that their description will be omitted.

As described with reference to FIG. 2 in Embodiment 1, by providing the resonance frequency regulating circuit 126, the resonance frequency of the antenna circuit 102 can be varied with the resonance frequency regulating circuit 126 in accordance with the output potential of the voltage detection circuit 122. Consequently, the electric power of a carrier wave or an amplitude modulation wave received by the semiconductor device can be reduced, thereby preventing circuits included in the semiconductor device from being damaged.

In FIG. 3, the capacitor 234 and the resistor 332 are provided as the filter circuit 124.

The capacitor 234 has impedance that decreases with increasing frequency. Therefore, as described with reference to FIG. 2 in Embodiment 1, providing the capacitor 234 allows an alternating leakage current that occurs in the resonance frequency regulating circuit 126 to be passed preferentially to the capacitor 234 included in the filter circuit 124.

The filter circuit 124 in this embodiment includes the resistor 332 in addition to the capacitor 234.

In the semiconductor device in this embodiment, providing the resistor 332 can set the impedance between one terminal of the capacitor 234 and the voltage detection circuit 122 (which corresponds to the impedance of the resistor 332) higher than the impedance between one terminal of the capacitor 234 and the wiring 116 (which corresponds to the AC impedance of the capacitor 234).

Therefore, an alternating leakage current that occurs in the resonance frequency regulating circuit 126 can be made to flow into the capacitor 234 more easily than into the voltage detection circuit 122, and thus passed (let out) to the wiring 116 via the capacitor 234.

As described above, by making an alternating leakage current that occurs in the resonance frequency regulating circuit 126 unlikely to flow into the voltage detection circuit 122 with the use of the resistor 332, the alternating leakage current can be prevented from flowing into the voltage detection circuit 122.

Since the voltage detection circuit 122 supplies an output potential to the resonance frequency regulating circuit 126 via the resistor 332, the impedance of the resistor 332 preferably has such a magnitude that it has no influence on the output potential.

In addition, the AC impedance of the capacitor 234 is preferably lower than the synthetic impedance of the impedance of the resistor 332 and the output impedance of the voltage detection circuit 122.

As described above, in the semiconductor device in this embodiment, by making an alternating leakage current that occurs in the resonance frequency regulating circuit 126 unlikely to flow into the voltage detection circuit 122 with the use of the resistor 332, the alternating leakage current can be passed (let out) to the wiring 116 via the capacitor 234.

As described above, in the semiconductor device in this embodiment, an alternating leakage current is made unlikely to flow into the voltage detection circuit 122 with the use of the resistor 332. In addition, the alternating leakage current is easily let out to the wiring 116 with the help of the capacitor 234. This can prevent the alternating leakage current from flowing into the voltage detection circuit 122 and prevent malfunction of the voltage detection circuit 122.

Consequently, the resonance frequency regulating circuit 126 can be controlled normally by the output potential of the voltage detection circuit 122. Thus, the resonance frequency of the antenna circuit 102 can be varied properly.

The use of the capacitor 234 which is a reactive element reduces the consumption of electric power independent of the operation or the like of the semiconductor device, allowing electric power consumed as leakage current to be used as drive electric power which is used for communication. Consequently, the maximum communication range or the number of concurrently recognized devices can be increased.

Further, the use of the resistor 332 facilitates a change of the magnitude of the impedance of a path through which current flows from the resonance frequency regulating circuit 126 to an output terminal of the voltage detection circuit 122. In addition, the resistor 332 is rather small among elements having high impedance, and thus can contribute to a reduction in the size of the semiconductor device.

Embodiment 3

In this embodiment, current flow in the AC circuit in the semiconductor device that has been described with reference to FIG. 2 in Embodiment 1 will be described with reference to FIG. 4.

Figure 4:
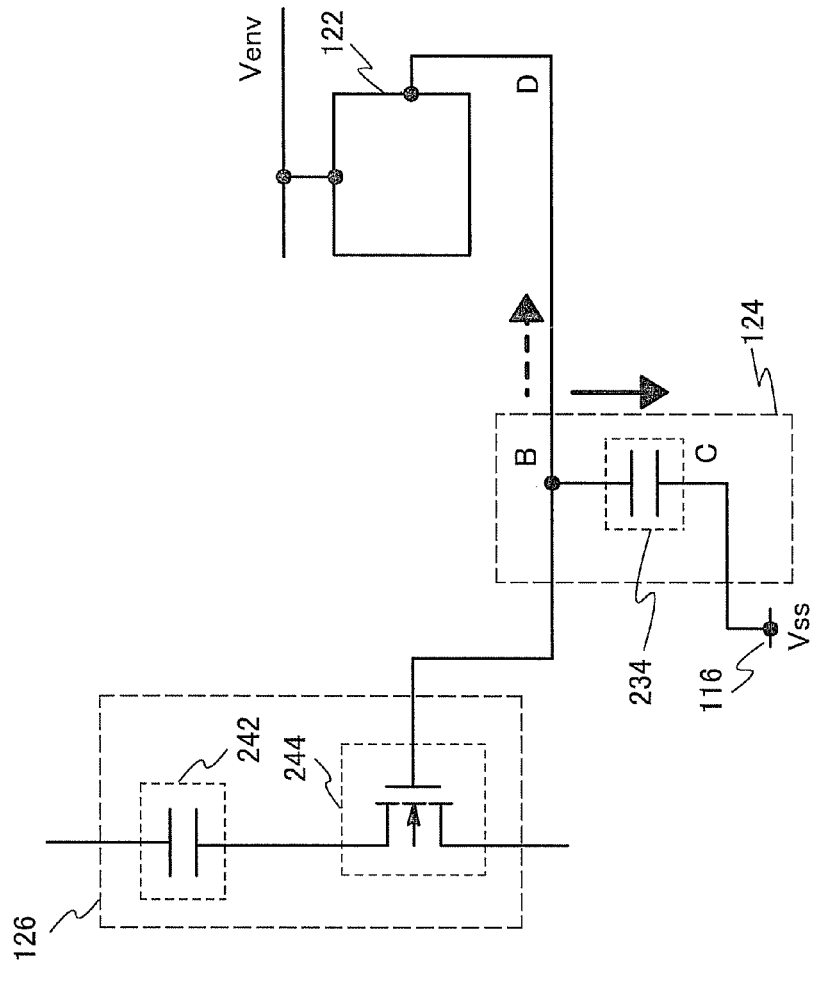
FIG. 4 is a diagram illustrating current flow in an AC circuit.

Paths through which alternating leakage current may flow from the resonance frequency regulating circuit 126 are a path through which current flow to a terminal supplied with the low supply voltage Vss via B-C, and a path through which current flow to the output terminal of the voltage detection circuit 122 via B-D, which are illustrated in FIG. 4.

In the configuration in FIG. 4, providing the capacitor 234 between B-C as the filter circuit 124 sets the impedance of B-C lower than the output impedance of the voltage detection circuit 122.

As described above, by setting the impedance of B-C lower than the synthetic impedance of B-D and the output terminal of the voltage detection circuit 122, alternating leakage current can be made to flow to the path through which current flow to the terminal supplied with the low supply voltage Vss via B-C more easily than to the path through which current flow to the output terminal of the voltage detection circuit 122 via B-D.

Consequently, providing the capacitor 234 as the filter circuit 124 makes leakage current easily flow into the capacitor 234, so that the leakage current can be prevented from flowing into the constant-voltage circuit 112.

In contrast, according to calculation, a capacitor in an AC circuit consumes power instantly, but average power per cycle is zero. This is because that a reactive element such as a capacitor stores electric energy and discharges the stored electric energy. Therefore, in an AC circuit, a reactive element such as a capacitor consumes no power. In other words, a reactive element included in a circuit in a semiconductor device or the like can be regarded as an element which consumes no electric power regardless of the operation or the like of the circuit.

For this reason, the use of the capacitor 234 which is a reactive element reduces the consumption of electric power independent of the operation or the like of the semiconductor device, allowing electric power consumed as leakage current to be used as drive electric power which is used for communication. Consequently, the maximum communication range or the number of concurrently recognized devices can be increased.

Embodiment 4

In this embodiment, current flow in the AC circuit in the semiconductor device that has been described with reference to FIG. 3 in Embodiment 2 will be described with reference to FIG. 5.

Figure 5:
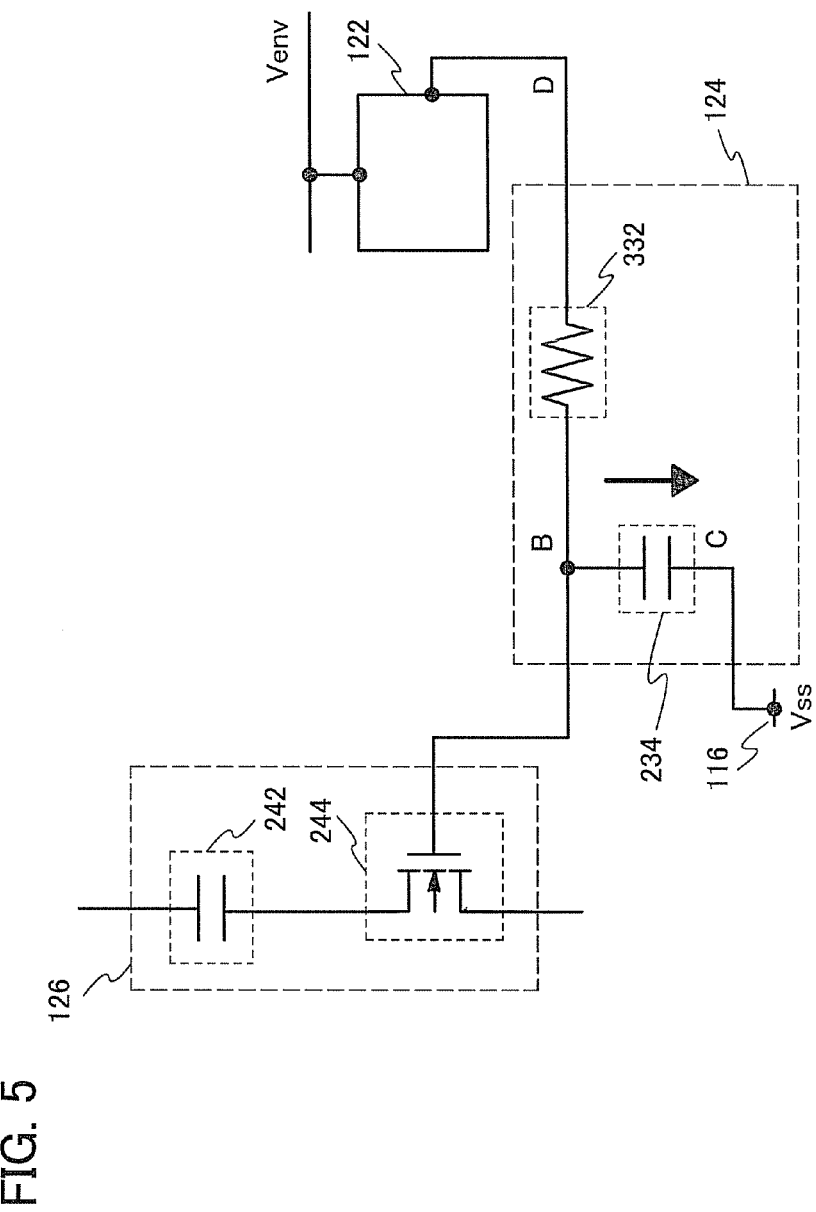
FIG. 5 is a diagram illustrating current flow in an AC circuit.

Paths through which alternating leakage current may flow from the resonance frequency regulating circuit 126 are a path through which current flow to a terminal supplied with the low supply voltage Vss via B-C, and a path through which current flow to the output terminal of the voltage detection circuit 122 via B-D, which are illustrated in FIG. 5.

In the configuration in FIG. 5, providing the capacitor 234 between B-C sets the impedance of B-C lower than the impedance of B-D.

Further, in the configuration in FIG. 5, providing the resistor 332 between B-D sets the impedance of B-D higher than the impedance of B-C.

Note that in the configuration in FIG. 5, since the resistor 332 is provided as the filter circuit 124 in addition to the capacitor 234, a difference between the impedance of B-C and the synthetic impedance of B-D and the output terminal of the voltage detection circuit 122 is larger than that in the configuration in FIG. 4.

As described above, by further increasing a difference between the impedance of B-C and the synthetic impedance of B-D and the output terminal of the voltage detection circuit 122, alternating leakage current can be made to flow to the path through which current flow to the terminal supplied with the low supply voltage Vss via B-C further more easily than to the path through which current flow to the output terminal of the voltage detection circuit 122 via B-D.

Consequently, providing the capacitor 234 and the resistor 332 as the filter circuit 124 makes leakage current flow into the capacitor 234 more easily, so that the leakage current can be prevented from flowing into the constant-voltage circuit 112.

The use of the capacitor 234 which is a reactive element reduces the consumption of electric power independent of the operation or the like of the semiconductor device, allowing electric power consumed as leakage current to be used as drive electric power which is used for communication. Consequently, the maximum communication range or the number of concurrently recognized devices can be increased.

Further, the use of the resistor 332 facilitates a change of the magnitude of the impedance of B-D. In addition, the resistor 332 is rather small among elements having high impedance, and thus can contribute to a reduction in the size of the semiconductor device.

Embodiment 5

Among semiconductor devices that wirelessly transmit and receive data, a passive-type semiconductor device has been particularly described in Embodiments 1 and 2 with reference to FIG. 1. However, the configuration in Embodiment 1 illustrated in FIG. 2 and the configuration in Embodiment 2 illustrated in FIG. 3 can be also applied to a semiconductor device containing a power source.

Figure 6:
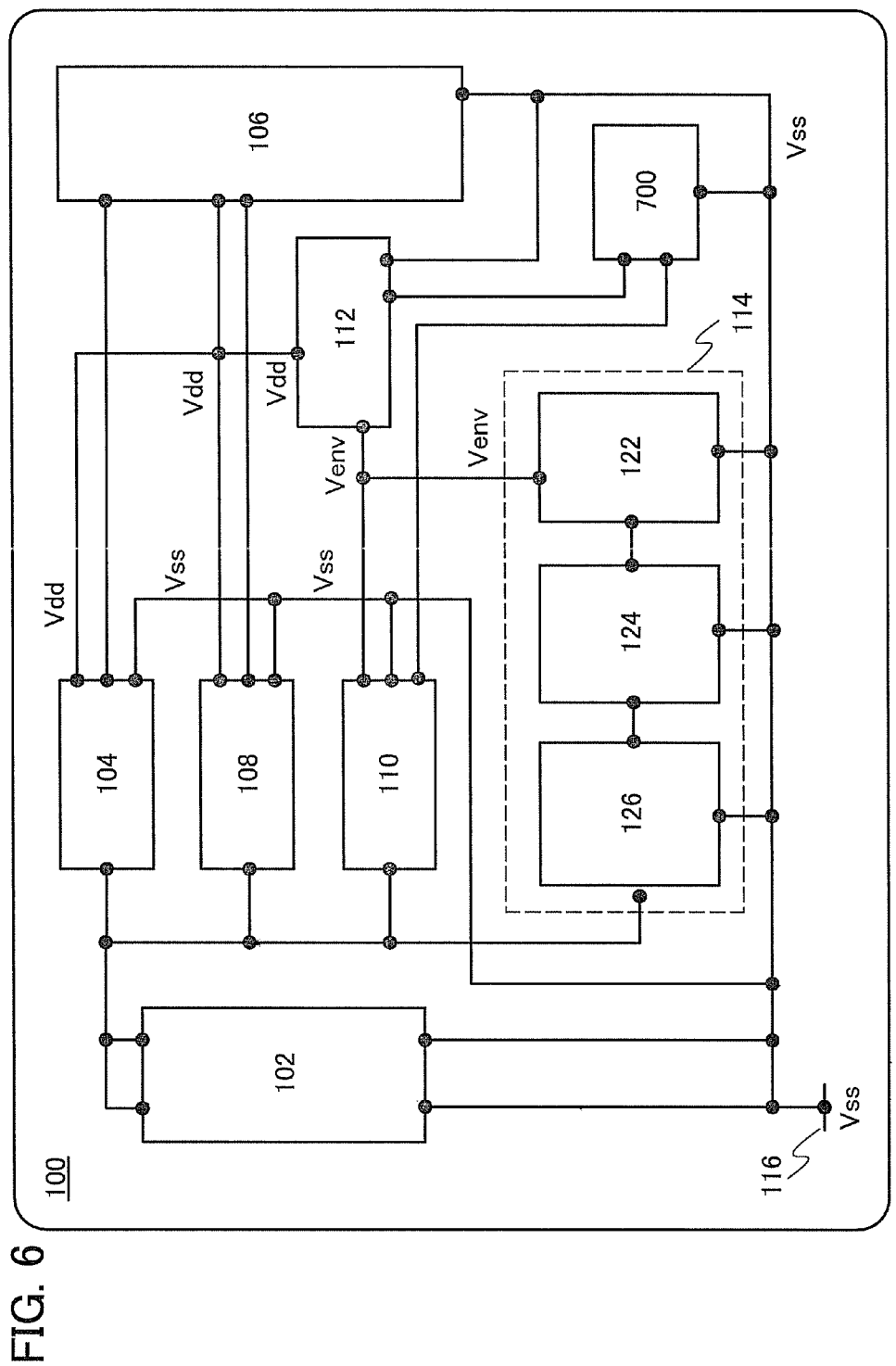
FIG. 6 is a diagram illustrating an example of a semiconductor device.

In this embodiment, an example of a semiconductor device that wirelessly transmits and receives data which is different from that in FIG. 1 will be described with reference to FIG. 6.

By providing another antenna circuit in addition to the antenna circuit 102 in the wireless tag 100, the wireless tag 100 can receive electromagnetic waves and the like that are generated randomly and then rectify them with the rectifier circuit 110, thereby obtaining electric power to store in a battery circuit 700.

When the high supply voltage Vdd supplied by the constant-voltage circuit 112 to the circuits such as the demodulation circuit 104 is not high enough to operate each circuit, the battery circuit 700 can supply voltage to the constant-voltage circuit 112. Alternatively, each circuit can be supplied with the high supply voltage Vdd by the constant-voltage circuit 112 and also with voltage by the battery circuit 700.

Thus, charging the battery circuit 700 enables continuous use of the wireless tag 100.

The battery circuit 700 can be a battery formed into a sheet form. For example, the use of a lithium polymer battery that includes a gel electrolyte, a lithium ion battery, a lithium secondary battery, or the like can reduce the size of the battery circuit 700. Alternatively, the battery circuit 700 can be a nickel-hydrogen battery, a nickel-cadmium battery, a capacitor having high capacitance, or the like.

Embodiment 6

In this embodiment, a structural example of a transistor in the semiconductor devices in the above embodiments will be described.

A structural example of a transistor including an oxide semiconductor layer as the semiconductor layer will be described with reference to FIGS. 7A to 7D and FIGS. 8A and 8B. FIGS. 7A to 7D and FIGS. 8A and 8B are cross-sectional schematic views of transistors.

Figure 7A:
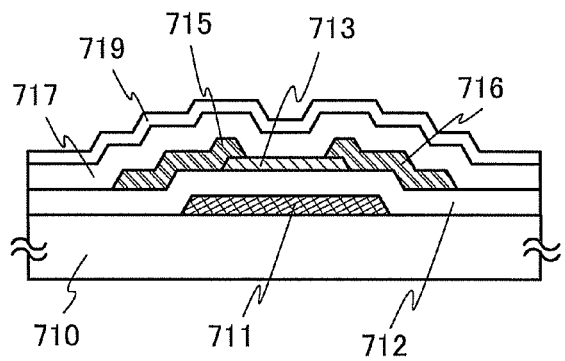
FIGS. 7A to 7D are diagrams each illustrating an example of the structure of a transistor.

A transistor in FIG. 7A is one of bottom-gate transistors and also referred to as an inverted staggered transistor.

The transistor in FIG. 7A includes a conductive layer 711 which is provided over a substrate 710, an insulating layer 712 which is provided over the conductive layer 711, an oxide semiconductor layer 713 which is provided over the conductive layer 711 with the insulating layer 712 provided therebetween, and a conductive layer 715 and a conductive layer 716 which are each provided over part of the oxide semiconductor layer 713.

Further, FIG. 7A illustrates an oxide insulating layer 717 which is in contact with the other part of the oxide semiconductor layer 713 (a portion in which the conductive layer 715 and the conductive layer 716 are not provided) of the transistor, and a protective insulating layer 719 which is provided over the oxide insulating layer 717.

Figure 7B:
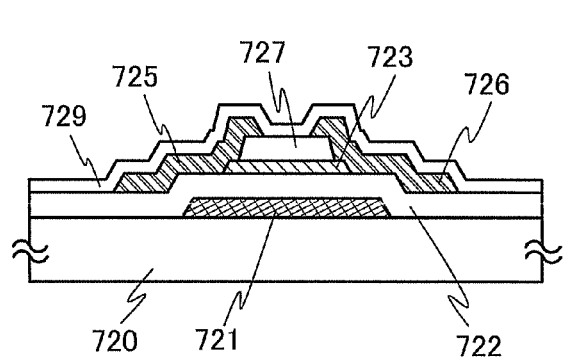

A transistor in FIG. 7B is a channel protective (also referred to as a channel stop) transistor which is one of bottom-gate transistors, and is also referred to as an inverted staggered transistor.

The transistor in FIG. 7B includes a conductive layer 721 which is provided over a substrate 720, an insulating layer 722 which is provided over the conductive layer 721, an oxide semiconductor layer 723 which is provided over the conductive layer 721 with the insulating layer 722 provided therebetween, an insulating layer 727 which is provided over the conductive layer 721 with the insulating layer 722 and the oxide semiconductor layer 723 provided therebetween, and a conductive layer 725 and a conductive layer 726 which are each provided over part of the oxide semiconductor layer 723 and part of the insulating layer 727.

Here, when part of or whole of the oxide semiconductor layer 723 overlaps the conductive layer 721, incident light on the oxide semiconductor layer 723 can be reduced.

Further, FIG. 7B illustrates a protective insulating layer 729 which is provided over the transistor.

Figure 7C:
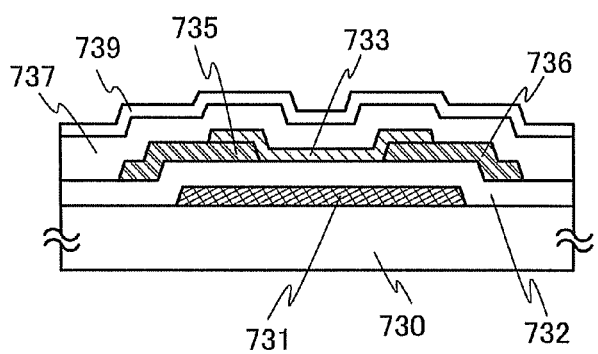

A transistor in FIG. 7C is one of bottom-gate transistors.

The transistor in FIG. 7C includes a conductive layer 731 which is provided over a substrate 730; an insulating layer 732 which is provided over the conductive layer 731; a conductive layer 735 and a conductive layer 736 which are each provided over part of the insulating layer 732; and an oxide semiconductor layer 733 which is provided over the conductive layer 731 with the insulating layer 732, the conductive layer 735, and the conductive layer 736 provided therebetween.

Here, when part of or whole of the oxide semiconductor layer 733 overlaps the conductive layer 731, incident light on the oxide semiconductor layer 733 can be reduced.

Further, FIG. 7C illustrates an oxide insulating layer 737 which is in contact with a top surface and a side surface of the oxide semiconductor layer 733, and a protective insulating layer 739 which is provided over the oxide insulating layer 737.

Figure 7D:
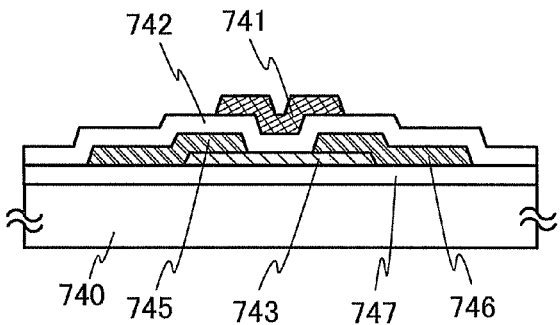

A transistor in FIG. 7D is one of top-gate transistors.

The transistor in FIG. 7D includes an oxide semiconductor layer 743 which is provided over a substrate 740 with an insulating layer 747 provided therebetween; a conductive layer 745 and a conductive layer 746 which are each provided over part of the oxide semiconductor layer 743; an insulating layer 742 which is provided over the oxide semiconductor layer 743, the conductive layer 745, and the conductive layer 746; and a conductive layer 741 which is provided over the oxide semiconductor layer 743 with the insulating layer 742 provided therebetween.

For each of the substrates (the substrate 710, the substrate 720, the substrate 730, and the substrate 740) a glass substrate (e.g., a barium borosilicate glass substrate and an aluminoborosilicate glass substrate), a substrate formed of an insulator (e.g., a ceramic substrate, a quartz substrate, and a sapphire substrate), a crystallized glass substrate, a plastic substrate, a semiconductor substrate (e.g., a silicon substrate), or the like can be used.

In the transistor in FIG. 7D, the insulating layer 747 serves as a base layer preventing diffusion of an impurity element from the substrate 740. The insulating layer 747 can be formed to have a single-layer structure or a stacked-layer structure using one or more of a silicon nitride layer, a silicon oxide layer, a silicon nitride oxide layer, a silicon oxynitride layer, an aluminum oxide layer, and an aluminum oxynitride layer, for example. Alternatively, a stacked layer of the above layer and a layer of a material having a light-blocking property is used for the insulating layer 747. Alternatively, a layer of a material having a light-blocking property is used for the insulating layer 747. Note that when a layer of a material having a light-blocking property is used as the insulating layer 747, incident light on the oxide semiconductor layer 743 can be reduced.

Note that as in the transistor in FIG. 7D, in the transistors in FIGS. 7A to 7C, the insulating layer 747 can be formed between the substrate 710 and the conductive layer 711, between the substrate 720 and the conductive layer 721, and between the substrate 730 and the conductive layer 731.

The conductive layers (the conductive layer 711, the conductive layer 721, the conductive layer 731, and the conductive layer 741) function as a gate of the transistor. For these conductive layers, as an example, a layer including a metal material such as molybdenum, titanium, chromium, tantalum, tungsten, aluminum, copper, neodymium, or scandium, or an alloy material which contains the metal material as a main component is used.

The insulating layers (the insulating layer 712, the insulating layer 722, the insulating layer 732, and the insulating layer 742) function as a gate insulating layer of the transistor.

A silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, an aluminum gallium oxide layer, or the like can be used for the insulating layers serving as gate insulating layers.

As each of the insulating layers (the insulating layer 712, the insulating layer 722, the insulating layer 732, and the insulating layer 742) each of which functions as a gate insulating layer, which is in contact with the oxide semiconductor layer (the oxide semiconductor layer 713, the oxide semiconductor layer 723, the oxide semiconductor layer 733, and the oxide semiconductor layer 743), an insulating layer containing oxygen is preferably used, and more preferably, the insulating layer containing oxygen includes a region (also referred to as an oxygen excessive region) where the proportion of oxygen is higher than that in the stoichiometric composition.

When the insulating layer serving as a gate insulating layer includes the oxygen excessive region, oxygen can be prevented from being transferred from the oxide semiconductor layer to the insulating layer serving as a gate insulating layer. Further, oxygen can be supplied to the oxide semiconductor layer from the insulating layer serving as a gate insulating layer. Thus, the oxide semiconductor layer in contact with the insulating layer serving as a gate insulating layer can be a layer containing a sufficient amount of oxygen.

Furthermore, the insulating layers serving as gate insulating layers are preferably formed by a method for preventing entry of impurities such as hydrogen and water to the insulating layers. The reason is as follows. When the insulating layer serving as a gate insulating layer includes impurities such as hydrogen and water, entry of impurities such as hydrogen and water to the oxide semiconductor layers, extraction of oxygen in the oxide semiconductor layers due to impurities such as hydrogen and water, or the like occurs. Thus, the oxide semiconductor layer has low resistance (n-type conductivity) and a parasitic channel might be formed. For example, the insulating layer serving as a gate insulating layer is formed by a sputtering method. As a sputtering gas, a high-purity gas from which impurities such as hydrogen and water are removed is preferably used.

Further, treatment for supplying oxygen is preferably performed on the insulating layer serving as a gate insulating layer. As the treatment for supplying oxygen, heat treatment in an oxygen atmosphere, oxygen doping treatment, and the like can be given. Alternatively, oxygen may be added by performing irradiation with oxygen ions accelerated by an electric field. Note that in this specification and the like, "oxygen doping treatment" means addition of oxygen to a bulk, and the term "bulk" is used in order to clarify that oxygen is added not only to a surface of a film but also to the inside of the film. In addition, "oxygen doping" includes "oxygen plasma doping" in which oxygen which is made to be plasma is added to a bulk.

Treatment for supplying oxygen is performed on the insulating layer serving as a gate insulating layer, so that a region where the proportion of oxygen is higher than that in the stoichiometric composition is formed in the insulating layer serving as a gate insulating layer. Providing such a region allows oxygen to be supplied to the oxide semiconductor layer. Consequently, oxygen defects in the oxide semiconductor layer or at the interface between the oxide semiconductor layer and the insulating layer can be reduced.

For example, in the case where an aluminum gallium oxide layer is used as the insulating layer serving as a gate insulating layer, treatment for supplying oxygen such as oxygen doping treatment is performed; thus, the composition of aluminum gallium oxide can be $Ga_xAl_{2-x}O_{3+\alpha}$ ($0<x<2$, $0<\alpha<1$).

Alternatively, an oxygen gas or a mixed gas containing an inert gas (e.g., nitrogen or a rare gas such as argon) and oxygen is introduced when the insulating layer serving as a gate insulating layer is formed by a sputtering method, whereby an oxygen excessive region may be formed in the insulating layer which functions as a gate insulating layer. Note that after the deposition by a sputtering method, heat treatment may be performed.

The oxide semiconductor layers (the oxide semiconductor layer 713, the oxide semiconductor layer 723, the oxide semiconductor layer 733, and the oxide semiconductor layer 743) function as a channel formation layer of the transistor. As an oxide semiconductor that can be used for the oxide semiconductor layer, the following metal oxides can be given: quaternary metal oxides (e.g., an In—Sn—Ga—Zn—O-based metal oxide), ternary metal oxides (e.g., an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, and a Sn—Al—Zn—O-based metal oxide), and binary metal oxides (e.g., an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Ga—O-based metal oxide, and an In—Sn—O-based metal oxide). Alternatively, unary metal oxides (an In—O-based metal oxide, a Sn—O-based metal oxide, a Zn—O-based metal oxide, or the like) can be used as the oxide semiconductor. Alternatively, as the oxide semiconductor, an oxide semiconductor obtained by adding silicon oxide ($SiO_2$) to the above metal oxide can also be used.

A material represented by $InMO_3(ZnO)_m$ (m>0) can be used as the oxide semiconductor. Here, M represents one or more metal elements selected from Ga, Al, Mn, and Co. For example, M can be Ga, Ga and Al, Ga and Mn, Ga and Co, or the like.

Here, an oxide semiconductor layer used for a transistor is preferably a layer from which an impurity such as hydrogen is sufficiently removed and to which oxygen is sufficiently supplied. Specifically, the concentration of hydrogen of the oxide semiconductor layer is, for example, $5\times10^{19}$ atoms/cm³ or less, preferably $5\times10^{18}$ atoms/cm³ or less, more preferably $5\times10^{17}$ atoms/cm³ or less.

The concentration of carriers in the oxide semiconductor layer, in which hydrogen concentration is sufficiently reduced and defect states in an energy gap due to oxygen deficiency are reduced by sufficiently supplying oxygen as described above, is less than $1\times10^{12}/cm^3$, preferably less than $1\times10^{11}/cm^3$, more preferably less than $1.45\times10^{10}/cm^3$.

For example, the off-state current (per unit channel width (1 μm) here) at room temperature (25° C.) is 100 zA (1 zA (zeptoampere) is $1\times10^{-21}$ A) or less, preferably 10 zA or less. In this manner, by using an i-type (intrinsic) or substantially i-type oxide semiconductor layer, the transistor having extremely favorable off-state current characteristics can be obtained.

The oxide semiconductor layer has a sodium concentration of $5\times10^{16}$ atoms/cm³ or less, preferably $1\times10^{16}$ atoms/cm³ or less, and more preferably $1\times10^{15}$ atoms/cm³ or less. The oxide semiconductor layer has a lithium concentration of $5\times10^{15}$ atoms/cm³ or less, preferably $1\times10^{15}$ atoms/cm³ or less. The oxide semiconductor layer has a potassium concentration of $5\times10^{15}$ atoms/cm³ or less, preferably $1\times10^{15}$ atoms/cm³ or less.

An alkali metal and an alkaline earth metal are adverse impurities for the oxide semiconductor and are preferably contained as little as possible. An alkali metal, in particular, sodium diffuses into an oxide and becomes $Na^+$ when an insulating film in contact with the oxide semiconductor is an oxide. In addition, sodium cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). This also causes variation in the characteristics. Such a problem is significant especially in the case where the hydrogen concentration in the oxide semiconductor is extremely low. Therefore, the concentration of an alkali metal is very preferably set to the above value in the case where the hydrogen concentration in the oxide semiconductor is lower than or equal to $5\times10^{19}$ cm⁻³, particularly lower than or equal to $5\times10^{18}$ cm⁻³.

Note that the above hydrogen concentration, sodium concentration, lithium concentration, and potassium concentration of the oxide semiconductor film are measured by SIMS (secondary ion mass spectroscopy).

The conductive layers (the conductive layers 715 and 716, the conductive layers 725 and 726, the conductive layers 735 and 736, and the conductive layers 745 and 746) each function as a source and a drain of the respective transistors. For example, as each of the conductive layers, a layer of a metal material such as aluminum, chromium, copper, tantalum, titanium, molybdenum, or tungsten, or an alloy material which contains any of the metal materials as its main component is used.

For example, as the conductive layer functioning as the source and the drain, a stacked layer of a layer of a metal such as aluminum or copper, and a layer of a high-melting-point metal such as titanium, molybdenum, or tungsten is used. Alternatively, a metal material layer of aluminum or copper is provided between a plurality of high-melting-point metal layers. The heat resistance of the transistor can be improved by using an aluminum layer to which an element for preventing generation of hillocks and whiskers (e.g., silicon, neodymium, or scandium) is added as the above conductive layer:

As the material of the conductive layer functioning as the source and the drain, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or such a metal oxide material containing silicon oxide is used.

The insulating layer 727 serves as a layer for protecting a channel formation layer of the transistor (also referred to as a channel protective layer).

As an example, an oxide insulating layer such as a silicon oxide layer is used for the oxide insulating layer 717 and the oxide insulating layer 737.

As an example, an inorganic insulating layer such as a silicon nitride layer, an aluminum nitride layer, a silicon nitride oxide layer, or an aluminum nitride oxide layer is used for the protective insulating layer 719, the protective insulating layer 729, and the protective insulating layer 739.

Figure 8A:
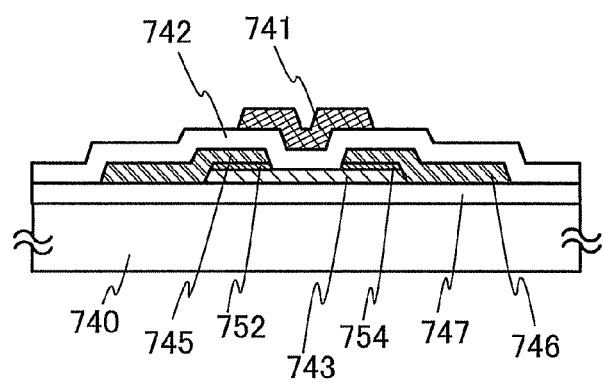
FIGS. 8A and 8B are diagrams each illustrating an example of the structure of a transistor.
Figure 8B:
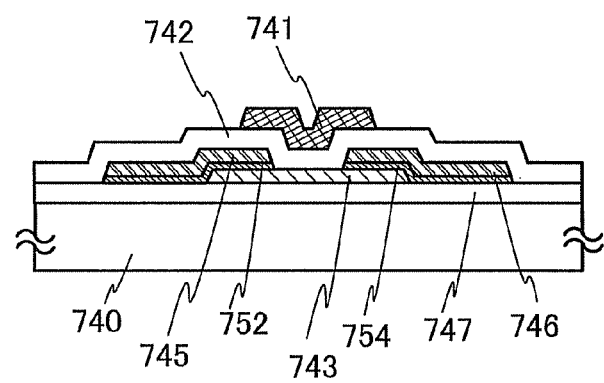

An oxide conductive layer functioning as a source region and a drain region may be provided as a buffer layer between the oxide semiconductor layer 743 and the conductive layer 745 and between the oxide semiconductor layer 743 and the conductive layer 746. FIGS. 8A and 8B illustrate transistors that have the same structure as the transistor in FIG. 7D except that they each have an oxide conductive layer.

In the transistors in FIGS. 8A and 8B, an oxide conductive layer 752 and an oxide conductive layer 754 which function as a source region and a drain region are formed between the oxide semiconductor layer 743 and the conductive layers 745 and 746 which function as the source and the drain. For the transistors in FIGS. 8A and 8B, the shapes of the oxide conductive layer 752 and the oxide conductive layer 754 vary depending on the manufacturing process.

In the transistor of FIG. 8A, an oxide semiconductor film and an oxide conductive film are stacked and processed in the same photolithography step to form the oxide semiconductor layer 743 and an oxide conductive film which have island shapes. After the conductive layer 745 and the conductive layer 746 each of which functions as a source or a drain are formed over the oxide semiconductor layer 743 and the island-shaped oxide conductive film, the island-shaped oxide conductive film is etched using the conductive layer 745 and the conductive layer 746 as masks, whereby the oxide conductive layer 752 and the oxide conductive layer 754 each of which functions as a source region or a drain region are formed.

In the transistor of FIG. 8B, an oxide conductive film is formed over the oxide semiconductor layer 743, a metal conductive film is formed thereover, and the oxide conductive film and the metal conductive film are processed in the same photolithography step to form the oxide conductive layer 752 and the oxide conductive layer 754 each of which functions as a source region and a drain region and the conductive layer 745 and the conductive layer 746 each of which functions as a source and a drain.

Note that in the etching treatment for processing the shape of the oxide conductive film, etching conditions (the kind of etchant, the concentration of etchant, the etching time, and the like) are appropriately adjusted so that the oxide semiconductor layer is not excessively etched.

As the formation method of the oxide conductive layer 752 and the oxide conductive layer 754, a sputtering method, a vacuum evaporation method (e.g., an electron beam evaporation method), an arc discharge ion plating method, or a spray method is used. As a material of the oxide conductive layers, zinc oxide, zinc aluminum oxide, zinc aluminum oxynitride, zinc gallium oxide, indium tin oxide containing silicon oxide (ITSO), or the like can be used. In addition, the above materials may contain silicon oxide.

When the oxide conductive layers are each provided as a source region or a drain region between the oxide semiconductor layer 743 and the conductive layer 745 or the conductive layer 746 which functions as a source or a drain, lower resistance of the source region and the drain region can be achieved. Consequently, the transistor can operate at high speed.

With the structure of the oxide semiconductor layer 743, the oxide conductive layer (the oxide conductive layer 752 or the oxide conductive layer 754) which functions as a drain region, and the conductive layer (the conductive layer 745 or the conductive layer 746) which functions as a drain, withstand voltage of the transistor can be increased.

Embodiment 7

In a semiconductor device that wirelessly transmits and receives data and includes a semiconductor integrated circuit using a plurality of minute semiconductor elements, malfunction of the semiconductor integrated circuit or damage to the semiconductor elements is likely to be caused by electrostatic discharge (ESD) from the outside. Especially in an antenna using a conductor with a large surface area, for example, electrostatic discharge is likely to occur.

In this embodiment, a structure which protects a semiconductor integrated circuit from electrostatic discharge will be described. Note that in this embodiment, an RF tag is used as an example of a semiconductor device that wirelessly transmits and receives data.

Structural examples of the RF tag are illustrated in FIGS. 9A to 9D. In FIGS. 9A to 9D, a semiconductor integrated circuit is protected by providing a shield using a conductive material in the vicinity of the semiconductor integrated circuit.

Figure 9A:
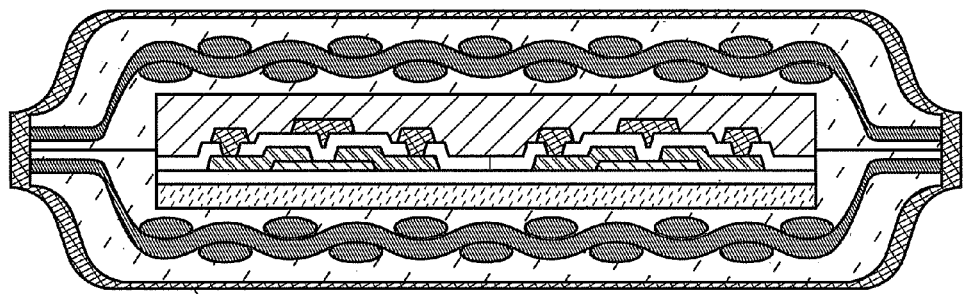
FIGS. 9A to 9D are diagrams each illustrating an example of the structure of an RF tag.

In FIG. 9A, a shield 2101 is formed so as to entirely cover the outside of the semiconductor integrated circuit. The shield 2101 is formed to a thickness that does not prevent an antenna from receiving a signal sent from a device capable of wirelessly transmitting and receiving data, such as an R/W, as much as possible.

Note that in FIG. 9A, the shield 2101 is foamed so as to cover a top surface, a bottom surface, and side surfaces of the semiconductor integrated circuit. The shield 2101 is formed so as to cover the entire surface of the semiconductor integrated circuit by steps of forming the shield on the top surface and parts of the side surfaces of the semiconductor integrated circuit, turning the semiconductor integrated circuit upside down, and forming the shield on the bottom surface and the other parts of the side surface of the semiconductor integrated circuit.

Figure 9B:
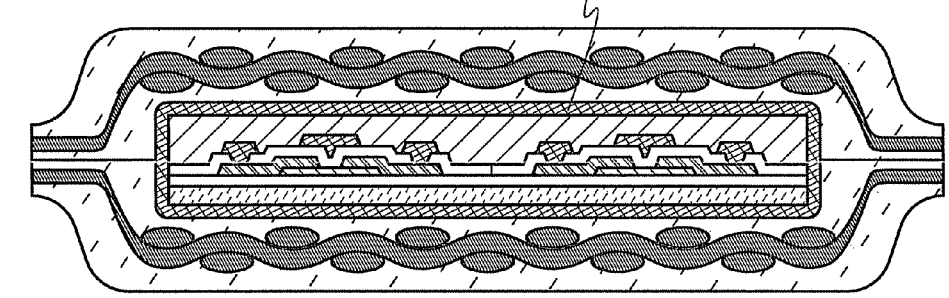

In FIG. 9B, a shield 2102 is placed inside insulators and provided so as to cover the entire surface of a semiconductor integrated circuit. A way to form the shield 2102 so that it covers the entire surface of the semiconductor integrated circuit in such a manner is, for example, to prepare separate semiconductor integrated circuits by cutting and then form the shield 2102 before each semiconductor integrated circuit is interposed between the insulators and then subjected to bonding. Another way is to form the shield in advance on a top surface and a bottom surface of each semiconductor integrated circuit, interpose the semiconductor integrated circuits between the insulators and subject the circuits to bonding, and cut them by laser irradiation so that the shield melts at a cut surface from the top and bottom directions to cover the side surfaces of the semiconductor integrated circuit. Note that the shield 2102 can be formed in other ways.

Figure 9C:
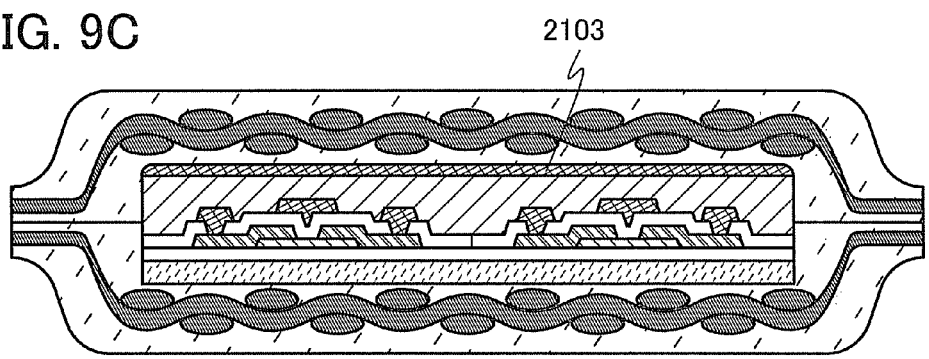

In FIG. 9C, a shield 2103 is placed inside insulators and is provided only on one side of a semiconductor integrated circuit. The shield 2103 is formed on the antenna side in FIG. 9C; however, the shield 2103 may be formed on the opposite side.

Providing a shield only on one side of a semiconductor integrated circuit can keep the shield from preventing the antenna from receiving a signal sent from a device capable of wirelessly transmitting and receiving data, such as an R/W, thereby ensuring favorable communication accuracy.

FIGS. 9A to 9C each show a case where the shield is formed in a film shape using a conductive material.

Figure 9D:
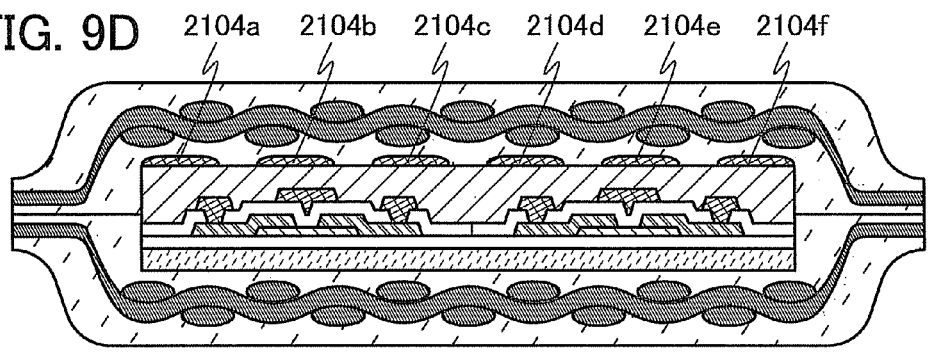

In FIG. 9D, island-shaped shields 2104a to 2104f are formed. The shields 2104a to 2104f have conductivity because they are formed using a conductive material, but they are dotted on the semiconductor integrated circuit so that there is no electrical continuity therebetween. For example, there is no electrical continuity between the shields 2104a and 2104b or between the shields 2104c and 2104f. Such a structure allows the shields 2104a to 2104f, which use a conductive material, to be a film equivalent to an insulator as a whole. Shields having such a structure can protect the semiconductor integrated circuit favorably from electrostatic discharge because the shields 2104a to 2104f use a conductive material, and make the shields 2104a to 2104f be a film equivalent to an insulator as a whole. This keeps the shields from preventing the antenna from receiving a signal sent from a device capable of wirelessly transmitting and receiving data, such as an R/W, so that favorable communication accuracy can be ensured.

A preferable material for the shields described with reference to FIGS. 9A to 9D is a conductor or a semiconductor. For example, a metal film, a metal oxide film, a semiconductor film, or a metal nitride film is used. Specifically, examples of the material include an element selected from titanium, molybdenum, tungsten, aluminum, copper, silver, gold, nickel, platinum, palladium, iridium, rhodium, tantalum, cadmium, zinc, iron, silicon, germanium, zirconium, and barium; and an alloy material, a compound material, a nitride material, an oxide material, or the like each containing any of the above elements as a main component.

Note that tantalum nitride, titanium nitride, or the like is used as the nitride material.

As the oxide material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide (ITO) containing titanium oxide, or the like can be used.

Alternatively, a semiconductor film having conductivity, which is obtained by adding an impurity element or the like to a semiconductor, or the like can be used. For example, a polycrystalline silicon film or the like doped with an impurity element such as phosphorus can be used.

For the shields, a conductive macromolecule polymer (also called a conductive polymer) can be used. As the conductive macromolecule, a so-called π electron conjugated conductive macromolecule can be used. Examples include polyaniline and its derivative, polypyrrole and its derivative, polythiophene and its derivative, and a copolymer of two or more kinds thereof.

A shield containing a conductive macromolecule may contain an organic resin or a dopant (a halogen, a Lewis acid, an inorganic acid, an organic acid, a transition metal halide, an organic cyano compound, a non-ionic surfactant, or the like).

Embodiment 8

In this embodiment, examples of electronic devices using any of the semiconductor devices in the above embodiments will be described with reference to FIGS. 10A to 10G.

The semiconductor device in the above embodiments is versatile. For example, the semiconductor device can be used in bills, coins, securities, bearer bonds, certificates, recording media, packing containers, vehicles, personal belongings (e.g., bags or glasses), foods, plants, animals, human bodies, clothes, products for daily use, or electronic devices (e.g., liquid crystal display devices, EL display devices, television sets, or mobile phones), tags for objects, commuter passes, carnets, various tickets or the like.

Figure 10A:
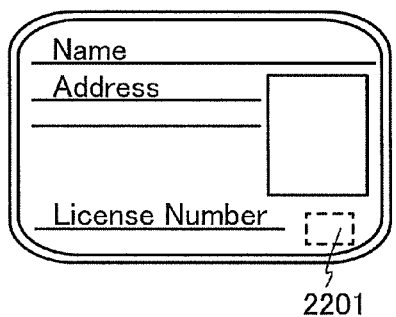
FIGS. 10A to 10G are diagrams each illustrating an example of an electronic device.

Certificates include driver's licenses, resident's cards and the like. FIG. 10A illustrates a driver's license with a semiconductor device 2201, as an example of a certificate. Note that bills, coins, securities, bearer bonds, certificates, and the like can be given an authentication function when provided with the semiconductor device 2201. The use of the authentication function can prevent forgery.

Figure 10B:
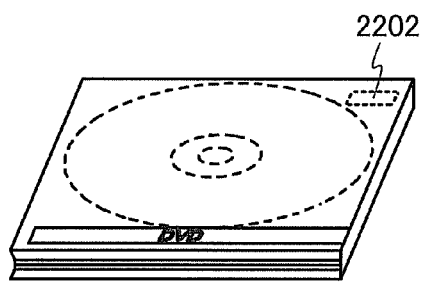

Examples of recording media include DVDs and video tapes. FIG. 10B illustrates a DVD with a semiconductor device 2202, as an example of a recording medium.

Figure 10C:
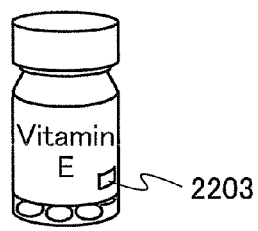
Figure 10D:
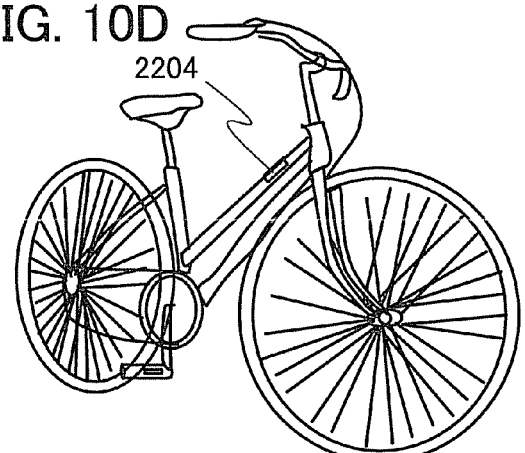

Packing containers include packing paper, plastic bottles, and the like. FIG. 10C illustrates a bottle with a semiconductor device 2203, as an example of a packing container. Note that the efficiency of a system such as an inspection system can be improved by providing the semiconductor device 2203 to packaging containers, recording media, personal belongings, foods, clothes, products for daily use, electronic devices, or the like.

Vehicles include bicycles and the like. FIG. 10C illustrates a bicycle with a semiconductor device 2204, as an example of a vehicle. Note that by providing the semiconductor device 2204 to vehicles, security against theft or the like can be increased.

Figure 10E:
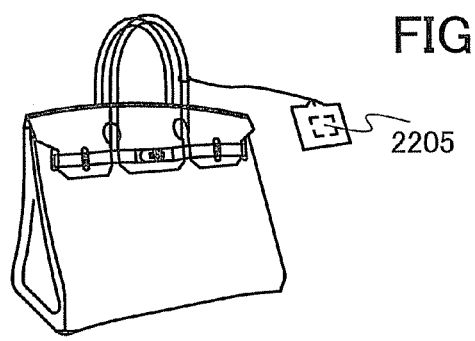
Figure 10F:
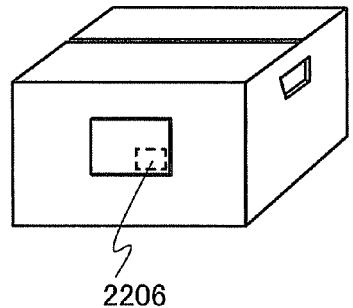

FIG. 10E illustrates a tag for an object with a semiconductor device 2205, and FIG. 10F illustrates a tag for an object with a semiconductor device 2206.

Figure 10G:
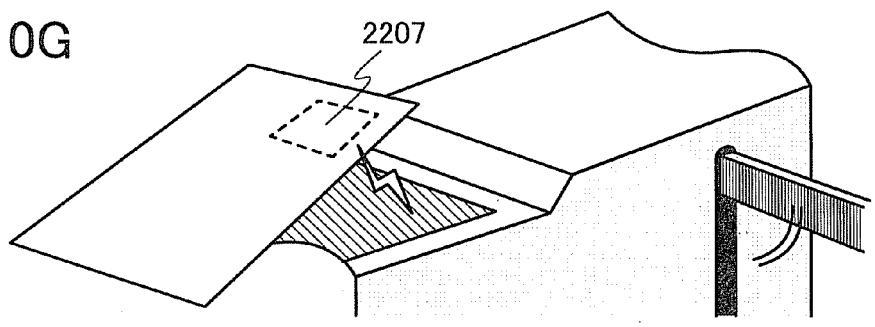

FIG. 10G illustrates a ticket with a semiconductor device 2207. Note that the semiconductor device 2207 can be manufactured using an element such as a thin film transistor over a flexible substrate like a resin substrate at low cost. Therefore, it is applicable particularly to disposable items such as carnets or a variety of thickets which are used only once or a small number of times.

Note that, in order to be fixed to an article, each of the semiconductor devices 2201 to 2207 is mounted to a printed circuit board, attached to a surface of the article, or embedded in the article. For example, in order to be fixed to a book, each of the devices is incorporated in paper or in order to be fixed to a package using an organic resin, each of the devices is incorporated in the organic resin. The semiconductor devices 2201 to 2207 can be small, thin, and lightweight. Thus, the devices do not destroy the design of the article or the like to which they are fixed.

Example 1

In this example, the results of tests on wireless tags, which are taken as examples of the semiconductor devices in the above embodiments, for their input power will be described with reference to FIG. 11 and FIGS. 12A and 12B.

Circuits A and B which correspond to semiconductor devices in the above embodiments were used as the wireless tags.

The circuit A corresponds to the semiconductor device in Embodiment 1 illustrated in FIG. 2. The circuit A includes the limiter circuit 114 including the voltage detection circuit 122, the filter circuit 124, and the resonance frequency regulating circuit 126. The filter circuit 124 includes the capacitor 234.

The circuit B corresponds to the semiconductor device in Embodiment 2 illustrated in FIG. 3. The circuit B includes the limiter circuit 114 including the voltage detection circuit 122, the filter circuit 124, and the resonance frequency regulating circuit 126. The filter circuit 124 includes the capacitor 234 and the resistor 332.

Circuits C to E which are semiconductor devices having circuit configurations different from those of the semiconductor devices in the above embodiments were used as wireless tags for comparison. The circuit configurations of the circuits C and D for comparison will be described with reference to FIGS. 12A and 12B.

The circuit C includes a filter circuit 1324. The filter circuit 1324 is the same as the semiconductor device illustrated in FIG. 3 except that the locations of the capacitor 234 and resistor 332 included in the filter circuit 1324 are opposite to those in the semiconductor device illustrated in FIG. 3 as illustrated in FIG. 12A. In other words, one terminal of the resistor 332 is connected to the resonance frequency regulating circuit 126, and the other terminal is connected to one terminal of the capacitor 234 and the voltage detection circuit 122.

Figure 12A:
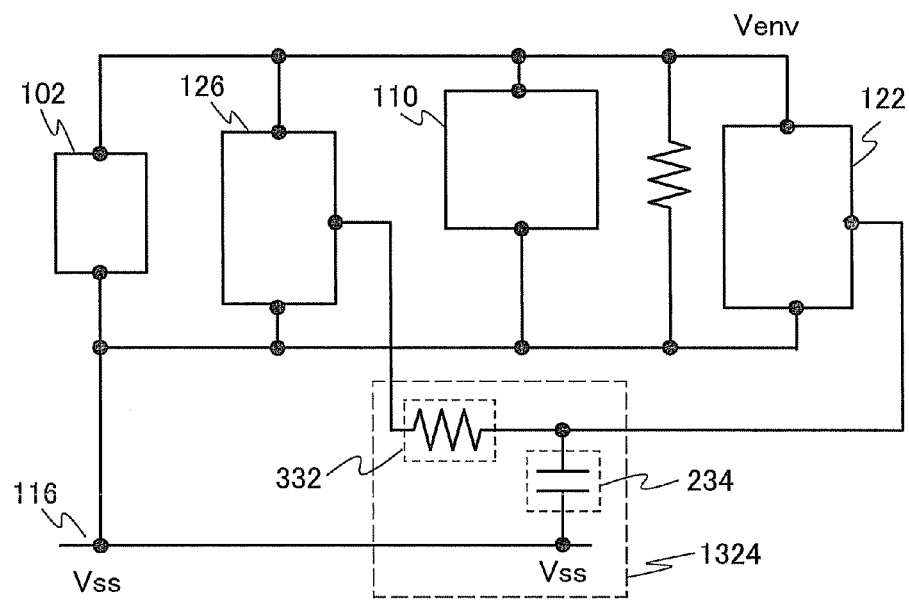
FIGS. 12A and 12B are diagrams each illustrating the circuit configuration of a circuit for comparison.
Figure 12B:
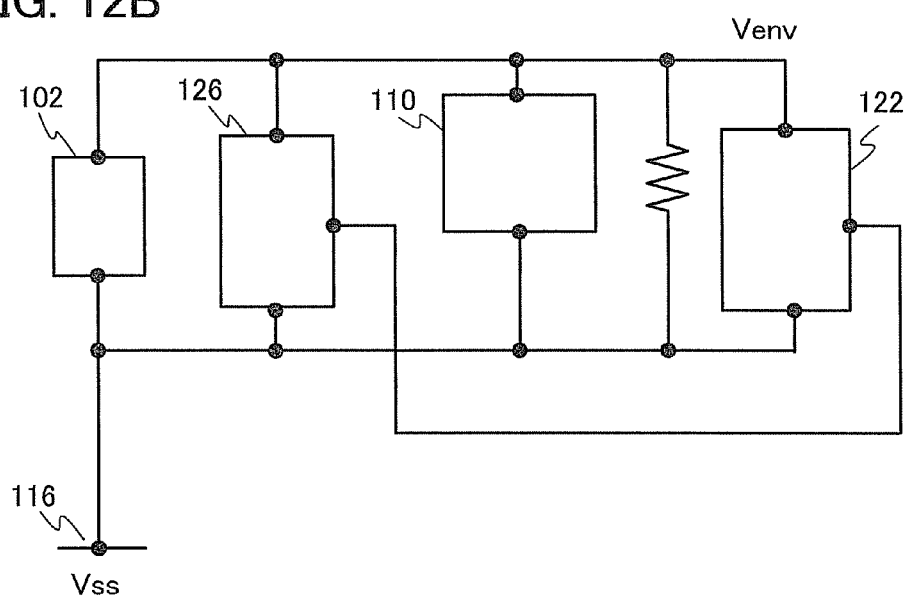

As illustrated in FIG. 12B, the limiter circuit of the circuit D includes the resonance frequency regulating circuit 126 and the voltage detection circuit 122, but not the filter circuit.

The circuit E does not include even the limiter circuit, i.e., does not include the voltage detection circuit, the filter circuit, and the resonance frequency regulating circuit.

Note that in the tests, the capacitance of the capacitor 234 was set to 12 pF, and the resistance of the resistor 332 was set to 62 kΩ.

The results of the tests on wireless tags for their input power which use the circuits A to E will be described with reference to FIG. 11.

Figure 11:
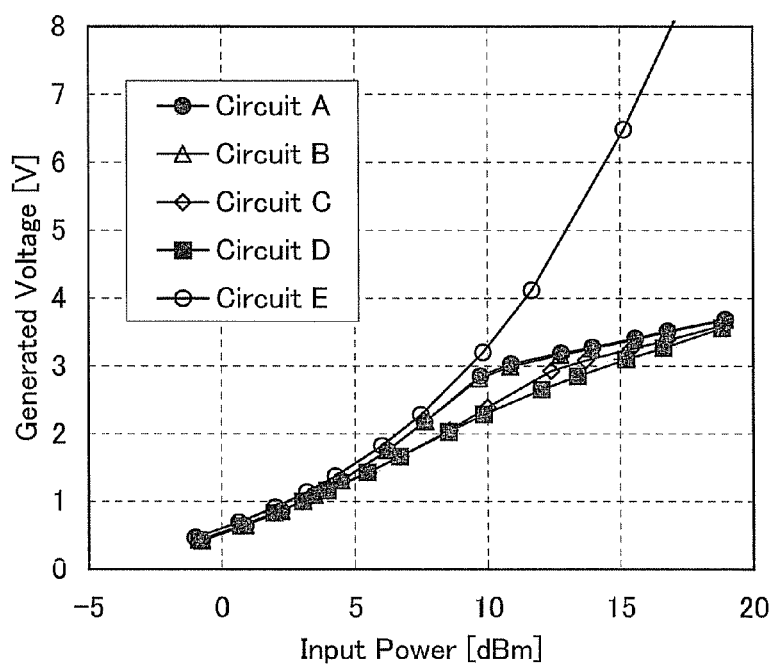
FIG. 11 is a diagram illustrating the input power of wireless tags.

FIG. 11 shows the calculation results of generated voltages (expressed in the unit V) versus the input power (expressed in the unit dBm) of the wireless tags. Here, generated voltage refers to the high supply voltage Vdd generated on the basis of a signal received by the antenna circuit.

First, the circuit E will be described.

The circuit E does not include the limiter circuit, so that its generated voltage is unlimited as shown in FIG. 11. Therefore, the generated voltage of the circuit E was as high as 8 V or more.

Thus, a wireless tag in operation which does not include the limiter circuit is given an excessive generated voltage when receiving excessive electric power of a carrier wave or an amplitude modulation wave, which may damage the wireless tag.

Next, the circuits C and D will be described.

The circuit D is the same as the circuit E except that it further includes the voltage detection circuit 122 and the resonance frequency regulating circuit 126. The circuit C is the same as the circuit D except that it further includes the filter circuit 1324.

The circuits C and D each include the voltage detection circuit 122 and the resonance frequency regulating circuit 126, so that their generated voltages were just around 3 V even when the input power of the wireless tags exceeded 5 dBm as shown in FIG. 11.

Next, the circuits A and B will be described.

As the circuits C and D, the circuits A and B each include the voltage detection circuit 122 and the resonance frequency regulating circuit 126, so that their generated voltages were just around 3 V even when the input power of the wireless tags exceeded 5 dBm as shown in FIG. 11.

As described above, the semiconductor devices in the above embodiments can prevent reception of an excessive electric power of a carrier wave or an amplitude modulation wave, thereby preventing the wireless tag from being damaged by an excessive generated voltage.

This application is based on Japanese Patent Application serial no. 2010-203878 filed with Japan Patent Office on Sep. 13, 2010, the entire contents of which are hereby incorporated by reference.

What is claimed is:

1. A semiconductor device comprising:
   an antenna circuit;
   a voltage detection circuit comprising:
      a first transistor including a first terminal and a second terminal; and
      a resistor including a first terminal and a second terminal, the first terminal of the resistor being electrically connected to the second terminal of the first transistor;
   a first capacitor including a first terminal electrically connected to the second terminal of the first transistor and the first terminal of the resistor, and a second terminal electrically connected to a wiring; and
   a resonance frequency regulating circuit comprising:
      a second capacitor including a first terminal electrically connected to a first terminal of the antenna circuit; and
      a second transistor including a first terminal electrically connected to a second terminal of the second capacitor, a second terminal electrically connected to a second terminal of the antenna circuit, and a gate electrically connected to the first terminal of the first capacitor and the voltage detection circuit.

2. The semiconductor device according to claim 1, wherein the second transistor comprises an oxide semiconductor layer as a semiconductor layer.

3. The semiconductor device according to claim 1, wherein resonance frequency of the antenna circuit is varied by the voltage detection circuit.

4. The semiconductor device according to claim 1, wherein the voltage detection circuit monitors a drive voltage generated on the basis of a signal received by the antenna circuit, and controls the resonance frequency regulating circuit when the drive voltage reaches a predetermined value, thereby varying resonance frequency of the antenna circuit.

5. The semiconductor device according to claim 1, wherein the wiring is configured to supply with a low supply voltage Vss.

6. The semiconductor device according to claim 1, wherein the first capacitor is configured to set an impedance between the second terminal of the first capacitor and the wiring lower than an impedance between the first terminal of the first capacitor and the voltage detection circuit.

7. The semiconductor device according to claim 1, wherein the first capacitor is configured to pass an alternating leakage current that occurs in the resonance frequency regulating circuit to the wiring.

8. A semiconductor device comprising:
   an antenna circuit;
   a voltage detection circuit comprising:
      a first transistor including a first terminal and a second terminal; and
      a first resistor including a first terminal and a second terminal, the first terminal of the first resistor being electrically connected to the second terminal of the first transistor;
   a first capacitor including a first terminal, and a second terminal electrically connected to a wiring;
   a second resistor including a first terminal electrically connected to the second terminal of the first transistor and the first terminal of the first resistor, and a second terminal electrically connected to the first terminal of the first capacitor; and a resonance frequency regulating circuit comprising:
- a second capacitor including a first terminal electrically connected to a first terminal of the antenna circuit; and
- a second transistor including a first terminal electrically connected to a second terminal of the second capacitor, a second terminal electrically connected to a second terminal of the antenna circuit, and a gate electrically connected to the first terminal of the first capacitor and the second terminal of the second resistor.

9. The semiconductor device according to claim 8, wherein the second transistor comprises an oxide semiconductor layer as a semiconductor layer.

10. The semiconductor device according to claim 8, wherein resonance frequency of the antenna circuit is varied by the voltage detection circuit.

11. The semiconductor device according to claim 8, wherein the voltage detection circuit monitors a drive voltage generated on the basis of a signal received by the antenna circuit, and controls the resonance frequency regulating circuit when the drive voltage reaches a predetermined value, thereby varying resonance frequency of the antenna circuit.

12. The semiconductor device according to claim 8, wherein the wiring is configured to supply with a low supply voltage Vss.

13. The semiconductor device according to claim 8, wherein the second resistor is configured to set an impedance between the first terminal of the first capacitor and the voltage detection circuit higher than an impedance between the second terminal of the first capacitor and the wiring.

14. The semiconductor device according to claim 8, wherein the first capacitor is configured to pass an alternating leakage current that occurs in the resonance frequency regulating circuit to the wiring.

15. A semiconductor device comprising:
an antenna circuit;
a resonance frequency regulating circuit configured to vary resonance frequency of the antenna circuit;
a voltage detection circuit configured to control the resonance frequency regulating circuit and comprising:
- a transistor including a first terminal and a second terminal; and
- a resistor including a first terminal and a second terminal, the first terminal of the resistor being electrically connected to the second terminal of the transistor; and
a capacitor including a first terminal electrically connected to the resonance frequency regulating circuit and the second terminal of the transistor and the first terminal of the resistor of the voltage detection circuit, and a second terminal electrically connected to a wiring.

16. The semiconductor device according to claim 15, wherein electric power of a carrier wave or an amplitude modulation wave received by the antenna circuit is reduced by varying the resonance frequency of the antenna circuit.

17. The semiconductor device according to claim 15, wherein the voltage detection circuit monitors a drive voltage generated on the basis of a signal received by the antenna circuit, and controls the resonance frequency regulating circuit when the drive voltage reaches a predetermined value, thereby varying the resonance frequency of the antenna circuit.

18. The semiconductor device according to claim 15, wherein the wiring is configured to supply with a low supply voltage Vss.

19. The semiconductor device according to claim 15, wherein the capacitor is configured to set an impedance between the second terminal of the capacitor and the wiring lower than an impedance between the first terminal of the capacitor and the voltage detection circuit.

20. The semiconductor device according to claim 15, wherein the capacitor is configured to pass an alternating leakage current that occurs in the resonance frequency regulating circuit to the wiring.

21. A semiconductor device comprising:
an antenna circuit;
a resonance frequency regulating circuit configured to vary resonance frequency of the antenna circuit;
a voltage detection circuit configured to control the resonance frequency regulating circuit and comprising:
- a transistor including a first terminal and a second terminal; and
- a first resistor including a first terminal and a second terminal, the first terminal of the first resistor being electrically connected to the second terminal of the transistor;
a capacitor including a first terminal electrically connected to the resonance frequency regulating circuit, and a second terminal electrically connected to a wiring; and
a second resistor including a first terminal electrically connected to the second terminal of the transistor and the first terminal of the first resistor of the voltage detection circuit, and a second terminal electrically connected to the first terminal of the capacitor and the resonance frequency regulating circuit.

22. The semiconductor device according to claim 21, wherein electric power of a carrier wave or an amplitude modulation wave received by the antenna circuit is reduced by varying the resonance frequency of the antenna circuit.

23. The semiconductor device according to claim 21, wherein the voltage detection circuit monitors a drive voltage generated on the basis of a signal received by the antenna circuit, and controls the resonance frequency regulating circuit when the drive voltage reaches a predetermined value, thereby varying the resonance frequency of the antenna circuit.

24. The semiconductor device according to claim 21, wherein the wiring is configured to supply with a low supply voltage Vss.

25. The semiconductor device according to claim 21, wherein the second resistor is configured to set an impedance between the first terminal of the capacitor and the voltage detection circuit higher than an impedance between the second terminal of the capacitor and the wiring.

26. The semiconductor device according to claim 21, wherein the capacitor is configured to pass an alternating leakage current that occurs in the resonance frequency regulating circuit to the wiring.

* * * * *